(12) United States Patent
Heimgartner et al.

(10) Patent No.: US 10,373,996 B2
(45) Date of Patent: Aug. 6, 2019

(54) OPTICAL MODULES INCLUDING FOCAL LENGTH ADJUSTMENT AND FABRICATION OF THE OPTICAL MODULES

(71) Applicant: ams Sensors Singapore Pte. Ltd., Singapore (SG)

(72) Inventors: Stephan Heimgartner, Passugg (CH); Ville Kettunen, Ruschlikon (CH); Nicola Spring, Wangen (CH); Alexander Bietsch, Thalwil (CH); Mario Cesana, Au (CH); Hartmut Rudmann, Jona (CH); Jukka Alasirnio, Jääli (FI); Robert Lenart, Zurich (CH)

(73) Assignee: ams Sensors Singapore Pte. Ltd, Singapore (SG)

( * ) Notice: Subject to any disclaimer, the term of this patent is extended or adjusted under 35 U.S.C. 154(b) by 0 days.

(21) Appl. No.: 15/651,510

(22) Filed: Jul. 17, 2017

(65) Prior Publication Data
US 2017/0317126 A1  Nov. 2, 2017

Related U.S. Application Data

(63) Continuation of application No. 14/177,552, filed on Feb. 11, 2014, now Pat. No. 9,748,297, which is a (Continued)

(51) Int. Cl.
*H04N 5/225* (2006.01)
*H01L 27/146* (2006.01)
(Continued)

(52) U.S. Cl.
CPC .... *H01L 27/14625* (2013.01); *G02B 27/0025* (2013.01); *H01L 27/14627* (2013.01);
(Continued)

(58) Field of Classification Search
CPC .................................................. H04N 5/23219
(Continued)

(56) References Cited

U.S. PATENT DOCUMENTS 6,934,460 B2  8/2005  Morris et al.
8,203,791 B2  6/2012  Lusinchi et al.
(Continued)

FOREIGN PATENT DOCUMENTS

CN  102668082 A  9/2012
EP  2341540  7/2011
(Continued)

OTHER PUBLICATIONS

Extended Search Report issued in EP Application No. 13851620, dated May 20, 2016, 4 pages.
(Continued)

*Primary Examiner* — Anthony J Daniels
(74) *Attorney, Agent, or Firm* — Fish & Richardson P.C.

(57) ABSTRACT

Fabricating optical devices can include mounting a plurality of singulated lens systems over a substrate, adjusting a thickness of the substrate below at least some of the lens systems to provide respective focal length corrections for the lens systems, and subsequently separating the substrate into a plurality of optical modules, each of which includes one of the lens systems mounted over a portion of the substrate. Adjusting a thickness of the substrate can include, for example, micro-machining the substrate to form respective holes below at least some of the lens systems or adding one or more layers below at least some of the lens systems so as to correct for variations in the focal lengths of the lens systems.

18 Claims, 21 Drawing Sheets

Related U.S. Application Data continuation of application No. 14/064,550, filed on Oct. 28, 2013, now Pat. No. 9,595,553.

(60) Provisional application No. 61/772,073, filed on Mar. 4, 2013, provisional application No. 61/721,747, filed on Nov. 2, 2012.

(51) Int. Cl.
*G02B 27/00* (2006.01)
*H01L 31/18* (2006.01)
*H01L 31/0216* (2014.01)
*H01L 31/0232* (2014.01)

(52) U.S. Cl.
CPC .. *H01L 27/14685* (2013.01); *H01L 27/14687* (2013.01); *H01L 31/02162* (2013.01); *H01L 31/02164* (2013.01); *H01L 31/02325* (2013.01); *H01L 31/18* (2013.01); *H04N 5/2254* (2013.01); *Y10T 29/49826* (2015.01)

(58) Field of Classification Search
USPC ........................................ 348/335, 345, 374
See application file for complete search history.

(56) References Cited

U.S. PATENT DOCUMENTS

| | | | |
|---|---|---|---|
| 8,610,823 | B2 | 12/2013 | Rossi et al. |
| 2004/0012698 | A1 | 1/2004 | Suda et al. |
| 2004/0051940 | A1 | 3/2004 | Liang et al. |
| 2005/0258425 | A1 | 11/2005 | Izumi |
| 2005/0274969 | A1 | 12/2005 | Suzuki |
| 2007/0001094 | A1 | 1/2007 | Rhodes |
| 2007/0126898 | A1 | 6/2007 | Feldman et al. |
| 2008/0220342 | A1 | 9/2008 | Klein et al. |
| 2008/0230934 | A1 | 9/2008 | Rudmann et al. |
| 2009/0256226 | A1* | 10/2009 | Tatani ................. H01L 27/1463 257/432 |
| 2009/0295953 | A1 | 12/2009 | Nozaki |
| 2010/0244165 | A1 | 9/2010 | Lake et al. |
| 2010/0253832 | A1* | 10/2010 | Duparre ............ H01L 27/14618 348/360 |
| 2010/0321564 | A1 | 12/2010 | Feldman et al. |
| 2011/0026142 | A1 | 2/2011 | Washizu |
| 2011/0032409 | A1 | 2/2011 | Rossi et al. |
| 2011/0096213 | A1 | 4/2011 | Hasegawa |
| 2011/0141337 | A1 | 6/2011 | Kuo |
| 2011/0176050 | A1* | 7/2011 | Fisher ...................... G02B 3/14 348/345 |
| 2011/0211105 | A1 | 9/2011 | Yamada et al. |
| 2011/0304930 | A1 | 12/2011 | Welch et al. |
| 2012/0307139 | A1 | 12/2012 | Cheng et al. |
| 2013/0033636 | A1 | 2/2013 | Pitts et al. |
| 2013/0160832 | A1 | 6/2013 | Krause et al. |
| 2013/0258181 | A1 | 10/2013 | Leung et al. |
| 2013/0286282 | A1* | 10/2013 | Yamamoto ........... H04N 5/2257 348/374 |
| 2013/0314583 | A1* | 11/2013 | Tang .................... H04N 5/2254 348/345 |

FOREIGN PATENT DOCUMENTS

| | | |
|---|---|---|
| WO | WO 2007/030226 | 3/2007 |
| WO | WO 2008/044937 | 4/2008 |
| WO | WO 2009/104669 | 8/2009 |
| WO | WO 2009/122934 | 10/2009 |
| WO | WO 2009/125654 | 10/2009 |
| WO | WO 2010/074743 | 7/2010 |
| WO | WO 2011/049635 | 4/2011 |
| WO | WO 2011/063347 | 5/2011 |
| WO | WO 2011/156926 | 12/2011 |
| WO | WO 2012/022000 | 2/2012 |
| WO | WO 2013/026174 | 2/2013 |
| WO | WO 2013/026175 | 2/2013 |

OTHER PUBLICATIONS

USPTO, Office Action in U.S. Appl. No. 14/064,550 (dated Jul. 28, 2016).

Search Report for ROC (Taiwan) Pat. Appln. No. 102139851 dated Jun. 16, 2017 (1 page).

* cited by examiner

OPTICAL MODULES INCLUDING FOCAL LENGTH ADJUSTMENT AND FABRICATION OF THE OPTICAL MODULES

CROSS-REFERENCE TO RELATED APPLICATION(S)

This application is a continuation under 35 U.S.C. § 120 of U.S. application Ser. No. 14/177,552, filed on Feb. 11, 2014, which is a continuation of U.S. application Ser. No. 14/064,550, filed on Oct. 28, 2013, now U.S. Pat. No. 9,595,553, which claims the benefit of priority of U.S. Provisional Patent Application Nos. 61/721,747, filed on Nov. 2, 2012, and 61/772,073, filed on Mar. 4, 2013. The entire contents of each of the aforementioned applications are herein incorporated by reference in their entirety.

FIELD OF THE DISCLOSURE

This disclosure relates to optical modules for cameras and other devices. It also relates to methods of manufacturing such modules using wafer-scale manufacturing steps.

BACKGROUND

During the manufacture of devices, in particular optical devices, manufacturing irregularities or manufacturing deviations may occur, for example, because of more or less unavoidable variations or inaccuracies in one or more of the process steps. For example, when the optical device includes one or more lens elements, a multitude of such lens elements on a wafer (referred to as an optics wafer) typically would have slightly varying focal lengths despite having the same nominal focal length. In some cases, the focal length may correspond to the flange focal length (FFL), which refers to the distance between the last physical plane of the device (i.e., the physical plane of device that is closest to sensor) and the focal plane of the device's lens system. More generally, the focal length may refer to any focal length parameter (e.g., the effective focal length (EFL)). In any event, variations in the focal lengths can result in the focal plane of the lens system lying off the image sensor plane, which can lead to inferior image quality.

SUMMARY

The present disclosure describes optical devices and methods of fabricating the optical devices. Various approaches are described to provide focal length adjustments for the lens systems to correct for variations in the focal lengths of the lens systems.

For example, in one aspect, a method of fabricating optical devices includes mounting a plurality of singulated lens systems over a substrate, adjusting a thickness of the substrate below at least some of the lens systems to provide respective focal length corrections for the lens systems, and subsequently separating the substrate into a plurality of optical modules, each of which includes one of the lens systems mounted over a portion of the substrate. In some implementations, adjusting a thickness of the substrate can include micro-machining to form respective holes below at least some of the lens systems so as to correct for variations in the focal lengths of the lens systems. In some implementations, adjusting a thickness of the substrate can includes adding one or more layers below at least some of the lens systems so as to correct for variations in the focal lengths of the lens systems.

In another aspect, a method of fabricating optical devices includes placing a plurality of individual lens stacks on a substrate, micro-machining the substrate at positions below one or more of the lens stacks to adjust focal lengths for the lens stacks, and subsequently dicing the substrate into a plurality of optical modules, each of which includes one or more of the lens stacks on respective portions of the substrate.

The described fabrication techniques can be advantageous in some implementations because they allows the individual lens systems to be tested prior to being mounted on a flange focal length (FFL) correction substrate. Such testing allows only those lens stacks that satisfy specified requirements (e.g., pass the optical or other tests) to be selected for use in the subsequent fabrication steps and to be mounted on the FFL correction substrate.

According to yet another aspect, a method of fabricating optical devices includes attaching a plurality of lens systems to a first side (i.e., lens stack side) of a substrate composed of a material that is substantially transparent to light of a predetermined wavelength or range of wavelengths, providing a channel FFL correction layer on a second side (i.e., sensor side) of the substrate; and removing selected portions of the channel FFL correction layer so as to adjust for respective focal length variations for at least some of the lens systems. In some implementations, instead of removing selected portions of the channel FFL correction layer so as to adjust for the respective focal length variations, one or more channel FFL correction layers are provided where needed to correct for the focal length variations.

According to a further aspect, an apparatus includes a substrate having a thickness that varies from one area of the substrate to another area. A plurality of singulated optical systems mounted over the substrate, wherein respective ones of the optical systems are disposed over different areas of the substrate so as to provide focal length corrections to at least some of the optical systems. The thicknesses of the different areas of the substrate can be provided, for example, so as to correct for variations in the focal lengths of the lens systems.

In another aspect, an optical module includes a substrate composed of a material that is transparent to light of a particular wavelength of range of wavelengths, and a plurality of lens systems attached over a first side of the substrate, wherein each lens system has a respective optical axis that intersects the substrate and corresponds to a respective optical channel in the module. The module includes a plurality of color filter layers disposed over different regions of the substrate, wherein the optical axis of each lens system intersects a respective one of the color filter layers. A spacer is disposed over the substrate between a respective pair of the color filter layers, and is substantially non-transparent to light of the particular wavelength of range of wavelengths. A non-transparent (e.g., black) coating also can be provided on a bottom surface of the substrate. The module includes a channel FFL correction layer, wherein the optical axis of at least one of the lens systems intersects the channel FFL correction layer. A module FFL correction layer also can be provided. An image sensor is attached over a second side of the substrate.

Modules that include multiple optical channels as well as single channel modules are described. In some cases, the thickness of a FFL correction substrate can be adjusted, as needed, to provide FFL correction for individual channels of a multi-channel module, and spacers can be provided to provide FFL correction for the module as a whole. In situations where the module includes only a single optical channel, spacers can be provided, and their height adjusted to provide a desired FFL correction for the optical channel.

In some cases, instead of mounting singulated lens systems on a FFL correction substrate, an optics/spacer stack that includes multiple lens stacks is attached to the FFL correction substrate.

Other aspects, features and advantages will be apparent from the following detailed description, the accompanying drawings and the claims.

DETAILED DESCRIPTION

Figure 1:
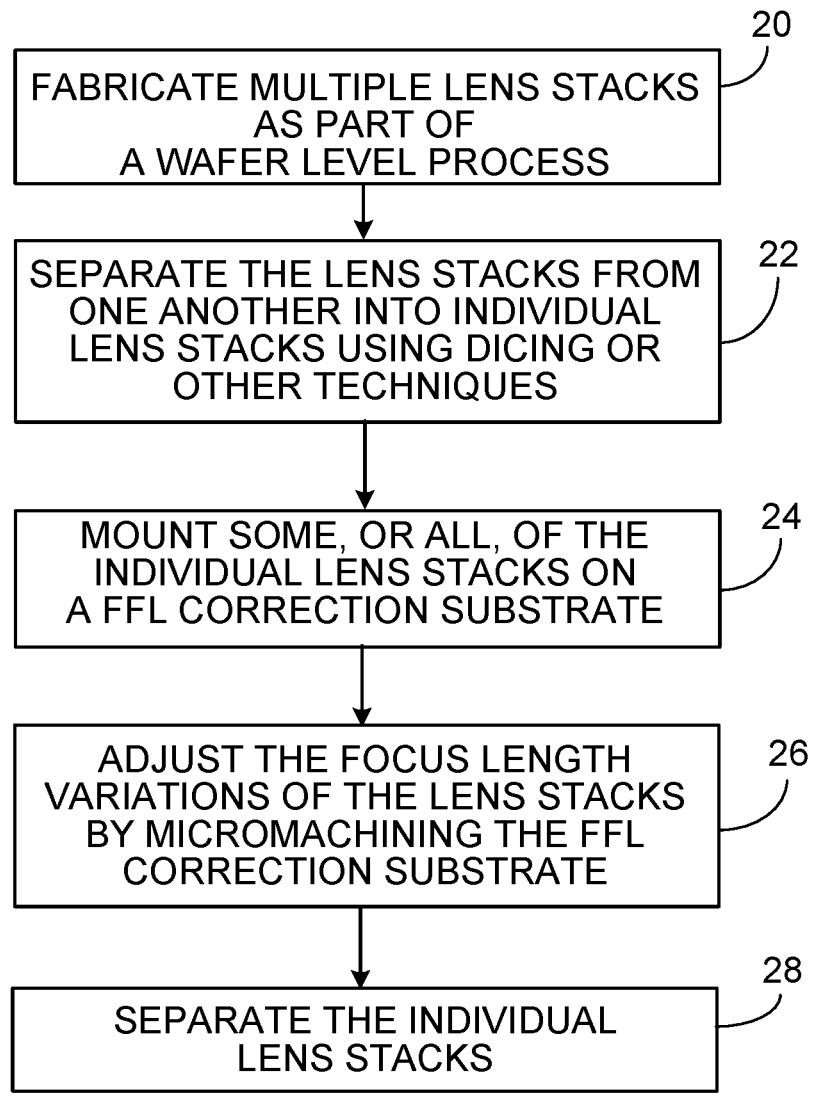
FIG. 1 is a flow chart of a method according to the present invention.

As indicated by FIG. 1, a method of fabricating multiple optical modules can include performing various steps at the wafer-level and incorporates features for correcting or otherwise adjusting focal length variations of optical elements in each device. In the present context, a wafer can be composed, for example, of a polymer material (e.g., a hardenable material such as a thermally or UV-curable polymer), a glass material, a semiconductor material, or a composite material comprising metals and polymers or polymers and glass materials. In general, a wafer refers to a substantially disk- or plate-like shaped item, such that its dimension in one direction (the z-direction or vertical direction) is small with respect to its extension in the other two directions (the x- and y-directions or lateral directions). Multiple similar structures or items can be arranged or provided on or in a (non-blank) wafer, for example, on a rectangular grid. The wafer can have openings (i.e., holes), and a wafer may even be free of material in a predominant portion of its lateral area.

As indicated by FIG. 1, multiple lens stacks can be fabricated, for example, as part of a wafer level process (block 20). The lens stacks are separated from one another into individual lens stacks using dicing or other techniques (block 22). Some, or all, of the individual lens stacks then are mounted (e.g., attached) on a FFL correction substrate (block 24), which as explained below may include one or more FFL correction layers. The lens stacks can be mounted on the FFL correction substrate, for example, using a bonding material such as glue or an epoxy resin. As part of the focal length variation correction or adjustment, the focal length of each lens stack can be measured individually. The focus length variations of the lens stacks are adjusted or corrected, for example, by micromachining the FFL correction substrate (block 26). The micromachining step may include, for example, milling, drilling, laser ablation, etching and/or photolithography, as well as other techniques. The individual lens stacks then can be separated by dicing or some other process (block 28).

Although some of the foregoing steps are performed at the wafer level, mounting the individual lens stacks onto the FFL correction substrate (i.e., block 24) preferably is performed by placing individual (i.e., singulated) lens stacks onto the FFL correction substrate. Such a method can be advantageous because it allows the individual lens stacks to be tested prior to being mounted on the FFL correction substrate. Such testing allows only those lens stacks that satisfy specified requirements (e.g., pass the optical or other tests) to be selected for use in the subsequent fabrication steps and to be mounted on the FFL correction substrate. Nevertheless, one, two or more lens stacks may be placed simultaneously on the FFL correction substrate.

Figure 2:
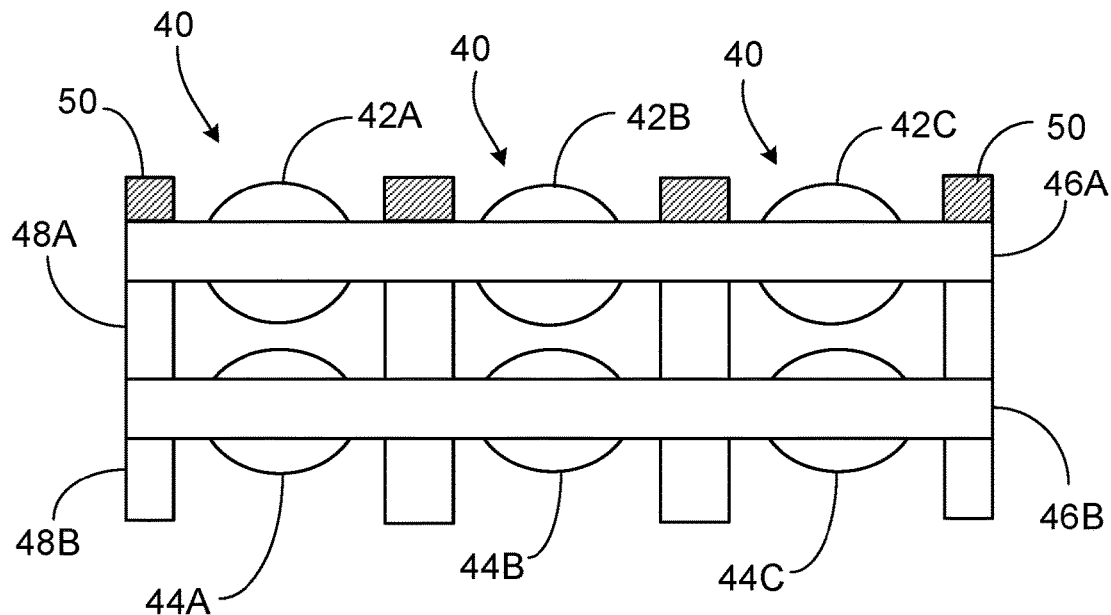
FIGS. 2 through 5 illustrate steps according to a first fabrication process.

FIGS. 2-5 illustrate an example of the method for fabricating multiple optical modules. As shown in FIG. 2, a wafer-level process is used to form multiple lens stacks 40 by attaching multiple wafers to form a wafer stack. In this example, each lens stack 40 includes pairs of passive optical components, such as plastic lenses 42A-42C and 44A-44C, arranged vertically one above another. Replication or other techniques can be used to form lenses on respective surfaces of optics wafers 46A, 46B which can be attached to one other by spacer wafers 48A, 48B. The lenses can redirect light, for example, by refraction and/or by diffraction. Thus, the lenses may be of generally convex shape or may be differently shaped, e.g., generally or partially concave. Each of lenses 42A-42C and 44A-44C can have a nominal focal length; for example, lenses 42A-42C can have the same first nominal focal length, and lenses 44A-44C can have the same second nominal focal length so that the overall focal length for each lens stack is about the same. However, in practical applications, the focal lengths of the lenses may deviate from their respective nominal focal lengths (e.g., as a result of manufacturing limitations).

In the illustrated example, baffles 50 are provided around the opening at the top of each lens stack 40. Baffles 50 can prevent undesired light from entering or leaving lens stack 40 at particular angles. Baffles 50 can be composed, for example, of a material that substantially attenuates or blocks light at a particular wavelength or in a wavelength range.

Figure 3:
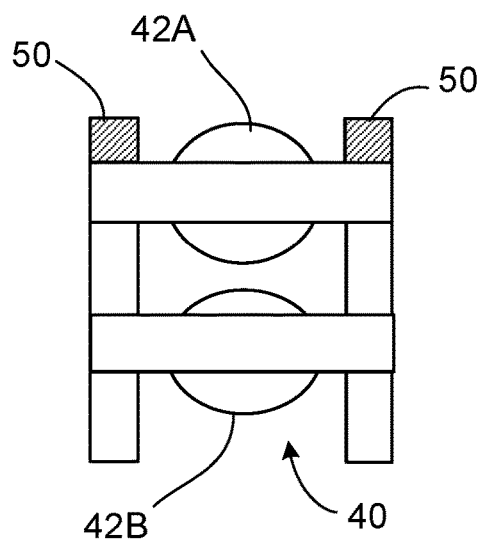
Figure 4:
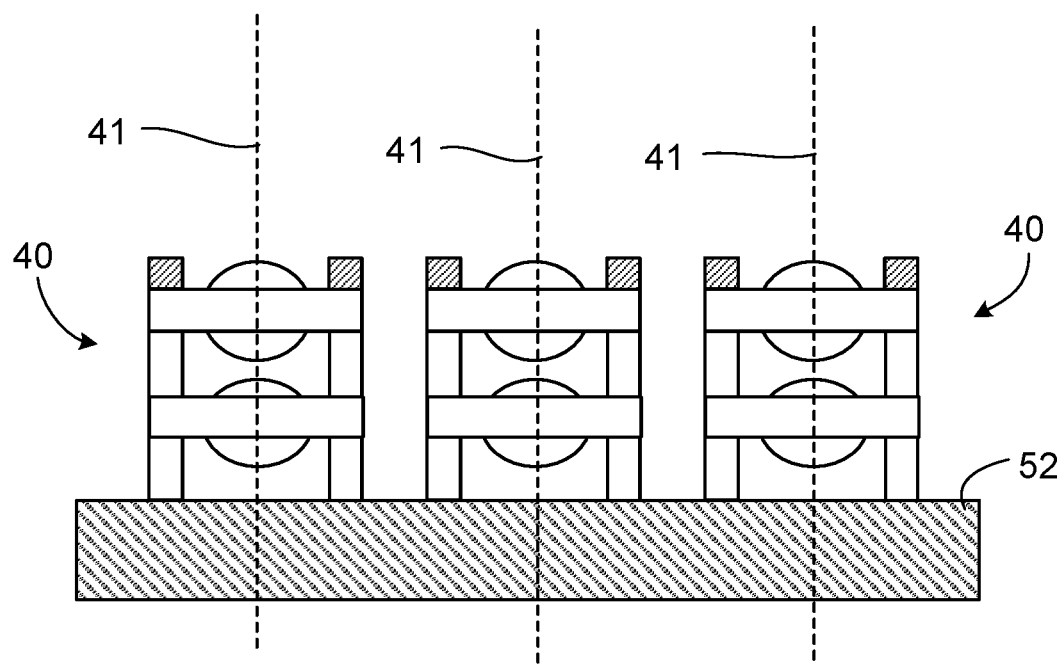

The wafer stack of FIG. 2 is then diced into individual lens stacks 40, an example of which is illustrated in FIG. 3. The individual lens stacks 40 then can be tested, and those lens stacks that satisfy any testing requirements or other specifications are mounted on a FFL correction substrate 52, as shown in FIG. 4. The optical axes for the optical channels are indicated by the dashed lines 41. FFL correction substrate 52 can be composed, for example, of a transparent material (e.g., glass) with specified properties (e.g., to allow light of a particular wavelength or within a particular wavelength range to pass with little or no attenuation).

The focal length of each lens stack 40 mounted on FFL correction substrate 52 is measured, and the offset in relation to the image plane of the sensor is determined. Based on the resulting measurements, FFL correction substrate 52 is micro-machined (if needed) to correct the focal length variation for each lens stack 40. The micro-machining can include forming a hole or other opening 54 in the sensor side of FFL correction substrate 52 below a particular lens stack 40. The depth of holes 54 may vary and, in some cases, no hole may be needed for one or more of the lens stacks 40 (e.g., if no correction or adjustment to the focal length is needed). The holes provide air spaces which result in adjustments to the respective focal length variations for the lens stacks. The index of refraction of the material of substrate 52 is different from (e.g., greater than) the index of refraction of vacuum or air in the holes 54. Thus, by adjusting the depths of each hole 54 in dependence of the deviation of the focal length of the associated optical components from the respective nominal focal length, deviations can be compensated, at least to some degree. The depths of the holes can be selected, for example, so that the resulting focal lengths of all the lens stacks are substantially the same as one another. Alternatively, the FFL correction layer can be adjusted by photolithographic techniques, which can be particularly helpful when several layers of FFL correction layers are used (see FIGS. 26 and 27). This can be particularly useful, for example, for fabrication of optical devices that include an array of lenses.

Figure 6:
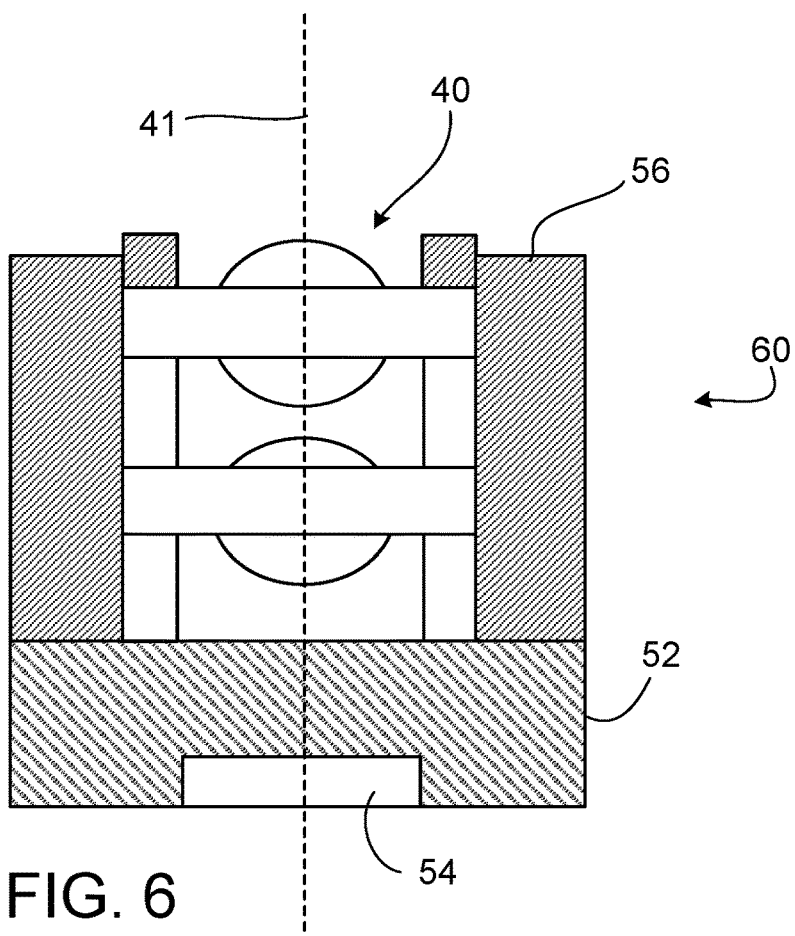
FIG. 6 is an example of an optical module resulting from the first fabrication process.

After mounting lens stacks 40 on FFL correction substrate 52, the gaps between adjacent lens stacks can be filled (or partially filled) with a non-transparent material 56 (e.g., black epoxy) so that each lens stack is surrounded by non-transparent walls that help prevent stray light from entering the lens stack during subsequent use. FFL correction substrate 52 (and non-transparent material 56, if present) then is diced or otherwise separated to form individual optical modules each of which includes a lens stack 40 with FFL correction. An example of such an optical module 60 is illustrated in FIG. 6.

In the example of FIGS. 2-6, each lens stack 40 includes an array of lenses aligned vertically with one another. In other implementations, the lens stack may include a different number of lenses, different types of lenses, or a different arrangement of lenses. Thus, lens stack 40 is an example of a lens system that can be incorporated into optical module 60. The lens system can include one or more lenses or other passive optical elements, which may be focused or non-focused.

Figure 7:
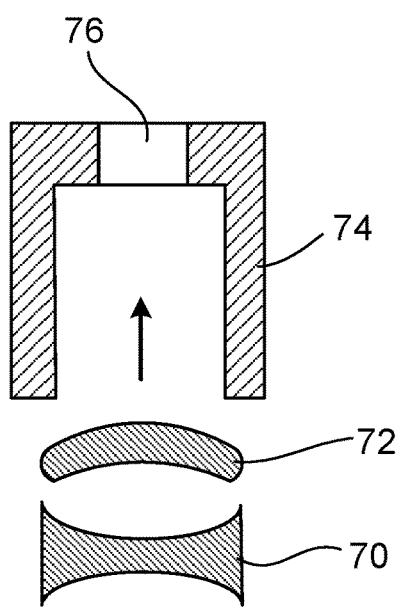
FIGS. 7 through 9 illustrate steps according to a second fabrication process.
Figure 8:
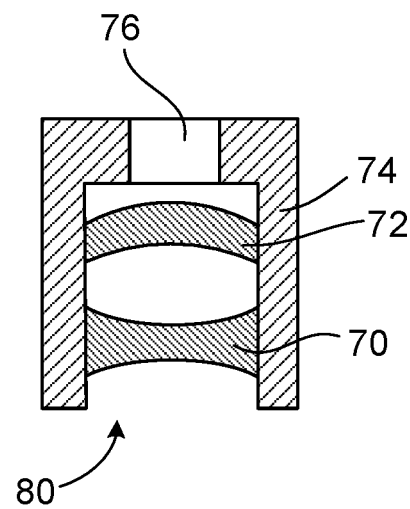

In the example of FIGS. 2-6, lens stacks 40 are fabricated using a wafer-level process that includes stacking multiple substrate wafers one atop the other to form a wafer stack that subsequently is diced to provide the individual lens stacks. In other implementations, the lens stacks can be made using an injection molding technique. For example, as shown in FIGS. 7 and 8, one or more plastic lenses 70, 72 made by injection molding are introduced into a lens barrel or other lens holder 74 to form a lens system, in this case a lens stack 80. Lens barrel 74 can be formed, for example, of non-transparent material such as a thermoplastic material (e.g., polycarbonate with fillers or a liquid crystal polymer with glass fibers) and includes an opening 76 at its top end to allow light to enter or exit.

Lens stacks 80 then can be mounted on a FFL correction substrate 52 in a manner similar to that described above in connection with FIG. 4 (i.e., individual singulated lens stacks 80 are mounted on FFL correction substrate 52). The focal length of each lens stack 80 mounted on FFL correction substrate 52 is measured, and based on the resulting measurements, FFL correction substrate 52 is micro-machined (if needed) to adjust the focal length variation for each lens stack 80. As described above in connection with FIG. 5, the micro-machining can include forming a hole 54 in the sensor-side surface of FFL correction substrate 52 below a particular lens stack 80 (see FIG. 9). The depth of holes 54 may vary and, in some cases, no hole may be needed for one or more of the lens stacks 80 (e.g., if no correction or adjustment to the focal length is needed). FFL correction substrate 52 then can be diced or otherwise separated to form individual optical modules each of which includes a lens stack 80 with FFL correction.

Figure 10:
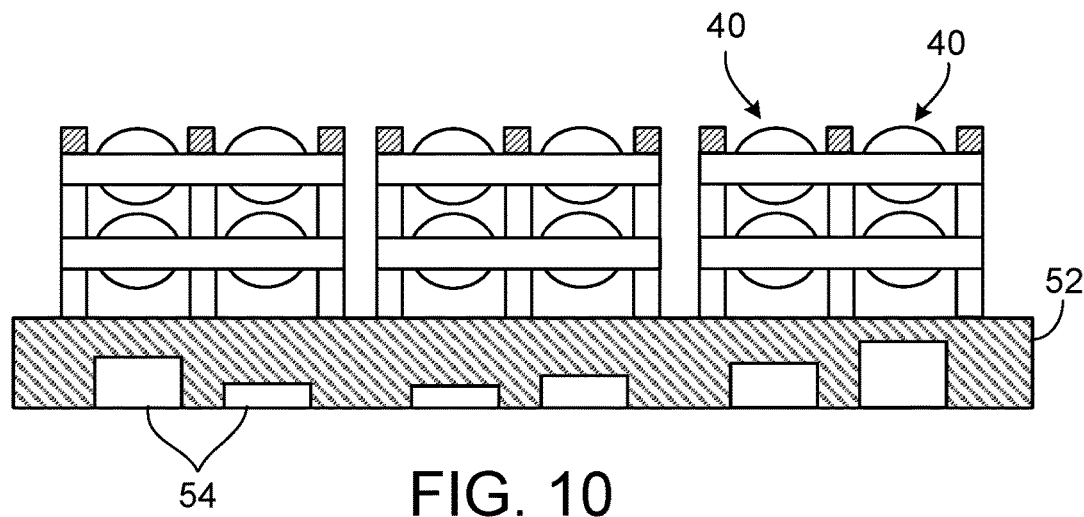
FIGS. 10 and 11 illustrate examples of lens stack arrays on a FFL correction layer.
Figure 11:
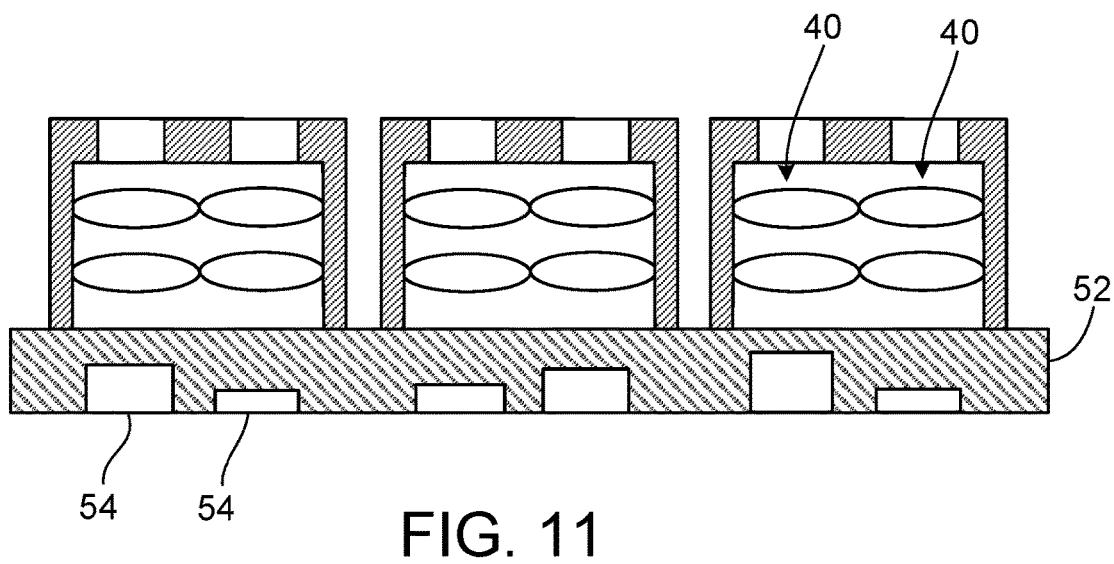

In the foregoing illustrated examples, each module includes a single lens stack. However, in other implementations, each module can include two or more lens stacks. In some cases, each module includes an array of lens stacks (e.g., a 2×2 array, a 3×3 array, a 4×4 array, or a M×N array, where M and N are positive integers that may be the same or different from one another). In such implementations, M×N arrays of lens stacks can be attached to a FFL correction substrate 52 as illustrated, for example, in FIGS. 10 and 11. FIG. 10, for example, illustrates M×N arrays of lens stacks 40 that were manufactured in a wafer-level technique, whereas FIG. 11 illustrates M×N arrays of lens stacks 40 formed by an injection molding technique. After dicing FFL correction layer 52, each module will include multiple lens stacks aligned side-by-side.

Figure 5:
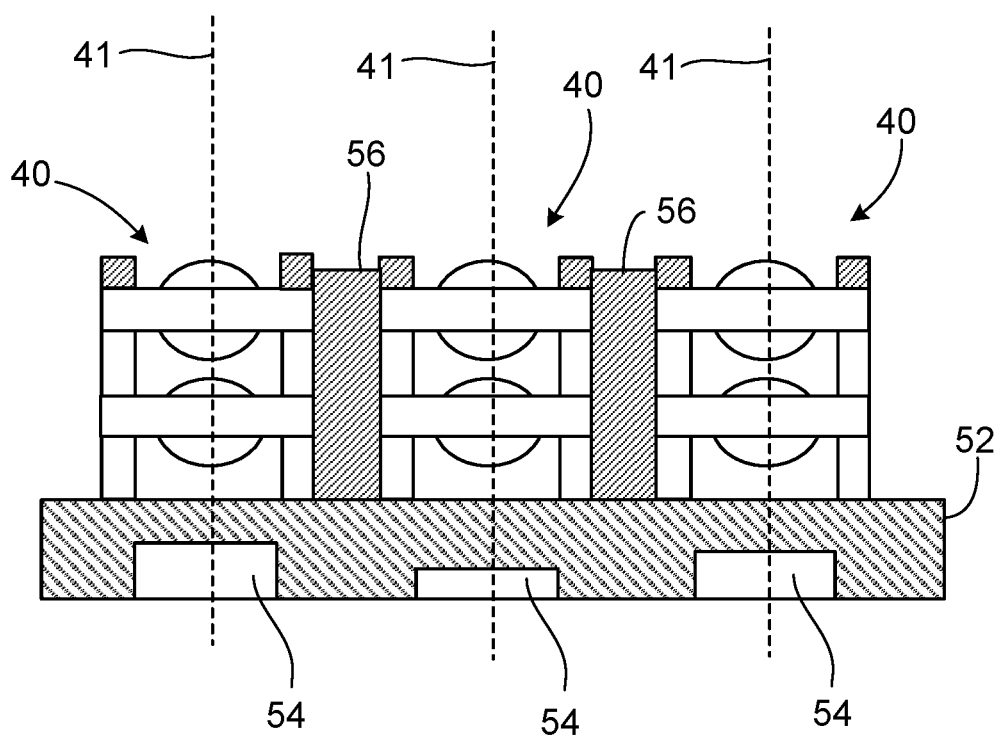
Figure 9:
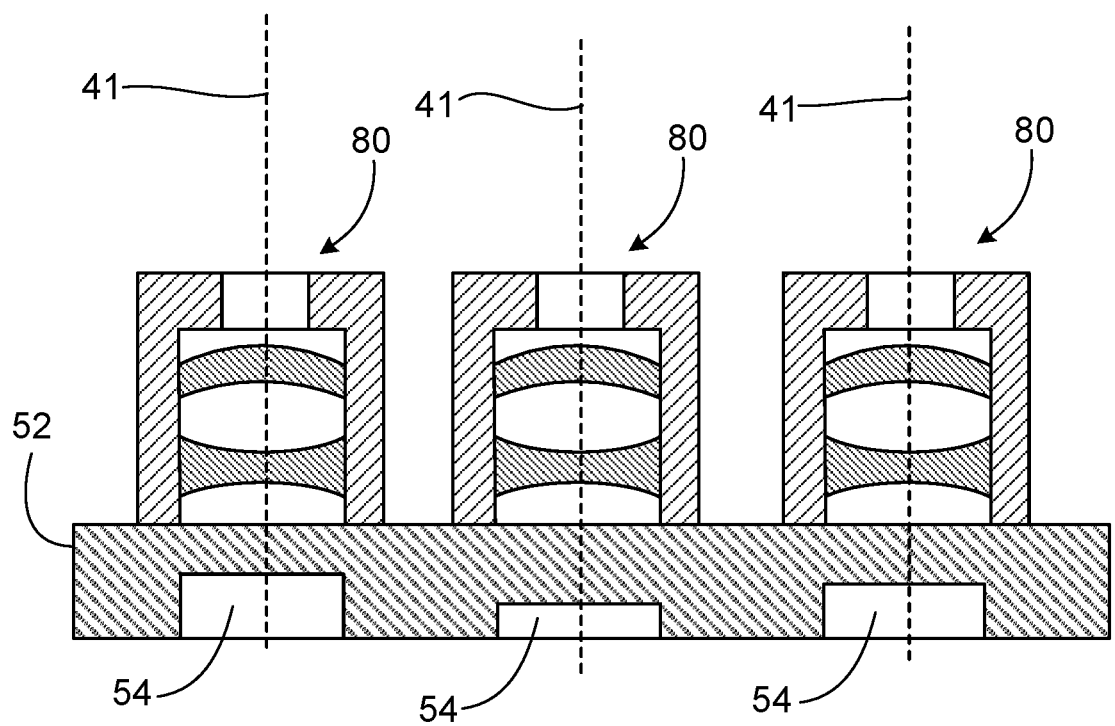
Figure 12:
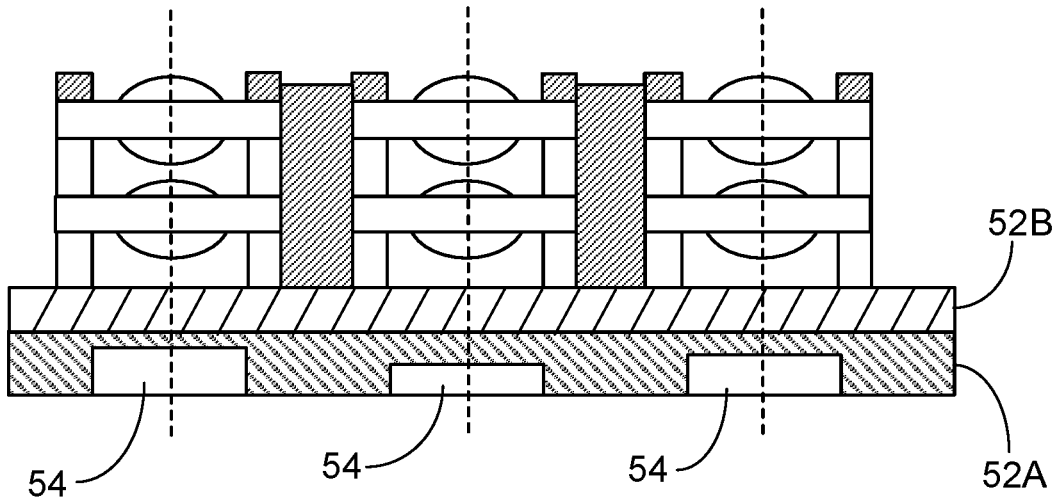
FIGS. 12 and 13 illustrated examples of FFL correction substrates that include multiple FFL correction layers.
Figure 13:
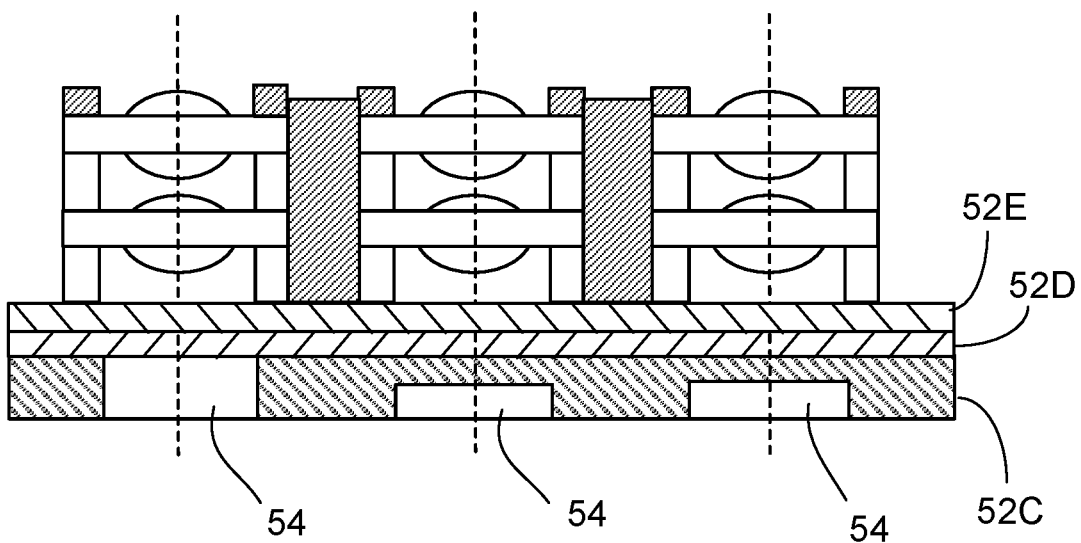
Figure 14:
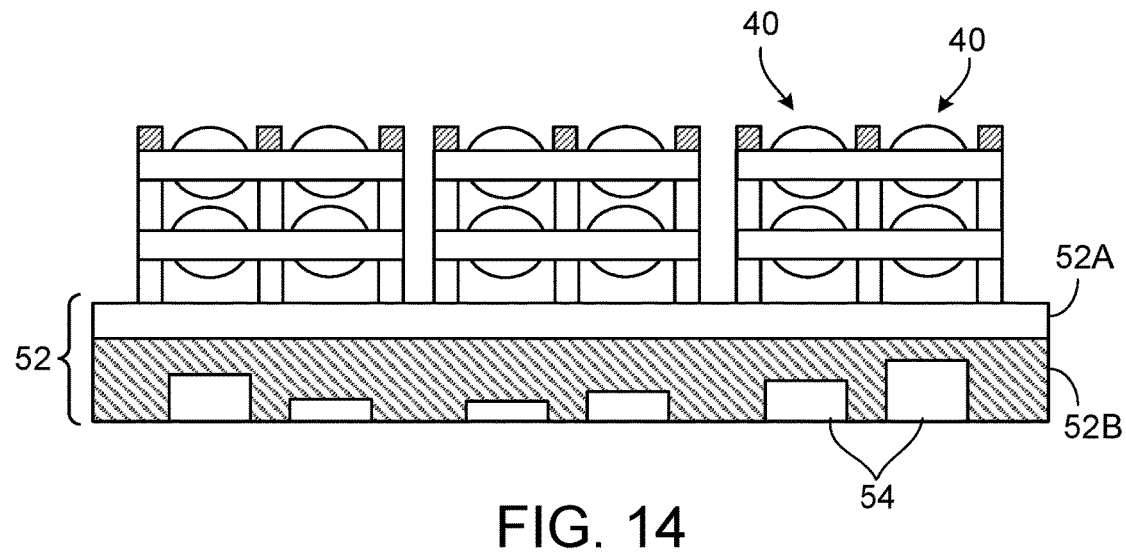
FIGS. 14 and 15 illustrate examples of lens stack arrays on FFL multi-layer substrates.
Figure 15:
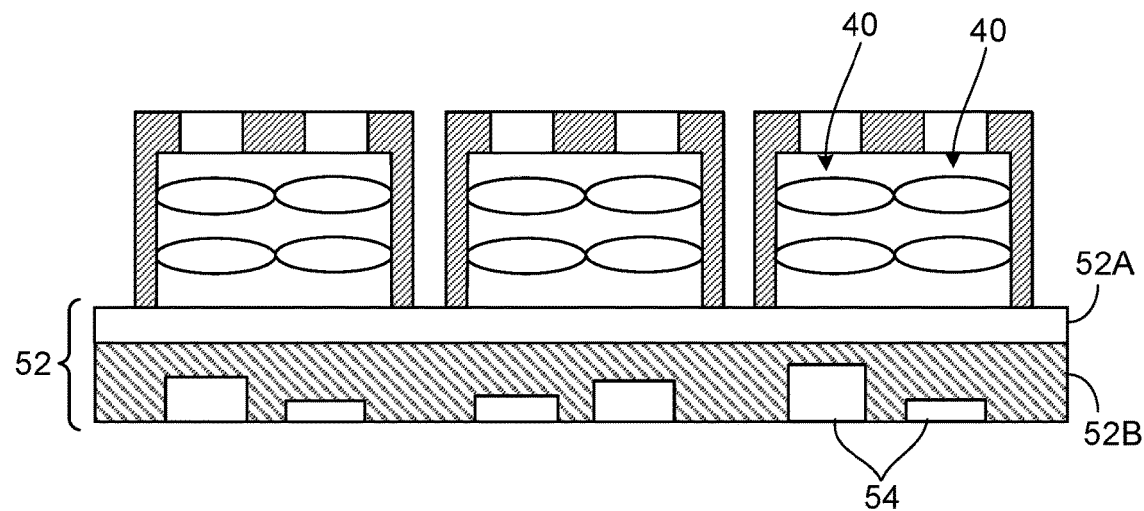

FFL correction substrate 52 can be composed of a single layer as in the examples of FIGS. 5 and 9. However, in other implementations, FFL correction substrate 52 can include multiple layers of different materials depending on the desired optical properties for the resulting optical modules. For example, FIG. 12 illustrates an example in which the FFL correction substrate is composed of a bottom layer 52A and a top layer 52B. In the illustrated example, holes for the FFL correction are formed in bottom layer 52A. FIG. 13 illustrates an example in which the FFL correction layer includes a bottom layer 52C, a middle layer 52D and a top layer 52E. In the illustrated example, holes 54 for the FFL correction are formed in bottom layer 52C. The various FFL layers can be composed, for example, of glass materials and/or polymer materials. M×N arrays of lens stacks also can be mounted on multi-layer FFL correction substrates. Examples are illustrated in FIGS. 14 and 15, which show, respectively, M×N arrays of lens stacks 40 on an FFL correction substrate 52 composed of multiple layers 52A, 52B of different materials. In some implementations, the FFL correction substrate may be composed of more than two different layers.

Figure 16:
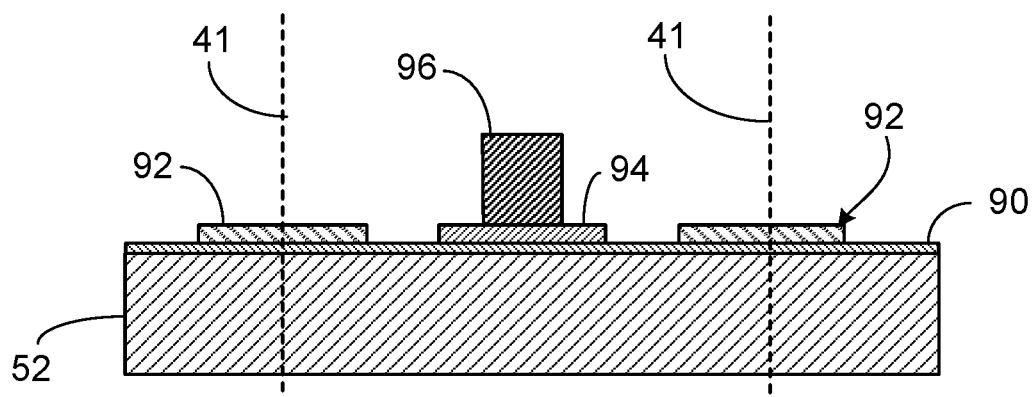
FIGS. 16 and 17 illustrate examples of FFL correction substrates with additional features.

In some implementations, one or more color filters and/or infra-red (IR) filters can be provided on FFL correction substrate 52 to obtain desired optical properties for the resulting optical modules. Color filters can include, for example, monochromous red, green and blue filters, or Bayer pattern filters. Also, in some implementations, IR filters or neutral density filters can be provided. An example is illustrated in FIG. 16, which includes an IR filter layer 90 on the lens stack side of FFL correction substrate 52 and color filters 92 on the IR filter layer. Color filters are disposed at locations that correspond to optical channels for each lens stacks (e.g., lens stacks 40 or 80). Thus, a lens stack 40 (or 80) can be mounted, for example, on or over each of the color filters 92.

Furthermore, in some implementations, each optical module includes multiple lens stacks. For example, a first lens stack may be aligned with a light emitting element (e.g., a LED), and a second lens stack may be aligned with a light detecting element (e.g., a photodiode). In that case, the color filters 92 on FFL correction substrate 52 may have different optical properties from one another, and a cross channel stray light reduction feature can be provided between the two channels. As illustrated in FIG. 16, cross channel stray light reduction can be implemented by a black spacer 96 atop a black coating layer 94. In some implementations, black spacer 96 is applied directly to FFL correction substrate 52 or IR filter layer 90 (i.e., without black coating layer 94). Black spacer 96 and black coating layer 94 are substantially non-transparent to light over a predetermined range of wavelengths (e.g., in the visible part of the spectrum, the IR part of the spectrum, and/or the UV part of the spectrum). Suitable coating techniques include, for example, spin coating, spraying and sputtering. Such coating techniques can be used to provide black coating layer 94, IR filter layer 90, and/or color filter coating 92. Multiple lens stacks 40 (or 80) can be mounted on a single FFL correction substrate 52, which then can be micro-machined to adjust the respective focal length variations. FFL correction substrate 52 then can be diced at the appropriate locations so that each module includes a pair of lens stacks, rather than just a single lens stack.

Figure 17:
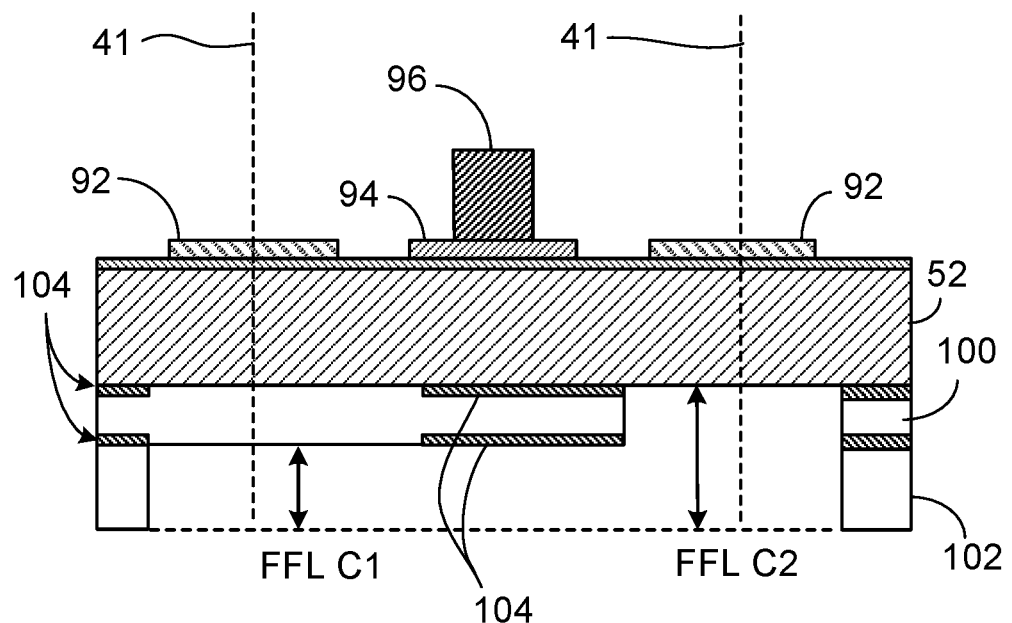

In some implementations, a black (i.e., non-transparent) coating can be added to the bottom (i.e., sensor-side) surface of FFL correction substrate, to the bottom surface of one or more of the FFL correction layers, and/or between adjacent FFL correction layers. FIG. 17 illustrates an example of a glass FFL correction substrate 52 that has an IR filter 90, color filters 92, and a black spacer 96 atop a black coating layer 94 for cross channel stray light reduction on the lens stack side of FFL correction substrate 52. The sensor side of substrate 52 includes a channel FFL correction layer 100 and a module FFL correction layer 102. Channel FFL correction layer 100 can provide FFL correction or adjustment that differs for the two channels (i.e., C1 and C2). Module FFL correction layer 102 can provide an additional FFL correction or other adjustment that applies equally to all the optical channels. Black coating layers 104 can be provided to help reduce stray light in the optical module. Coating techniques (e.g., spin coating, spraying and sputtering) can be used to provide black coating layers 104 and/or channel FFL correction layer 100. In a particular implementation, the thickness of the FFL correction layers is approximately as follows: 400 μm for FFL correction substrate 52, 25 μm for FFL correction layer 100, and 150 μm for FFL correction layer 102.

Figure 18:
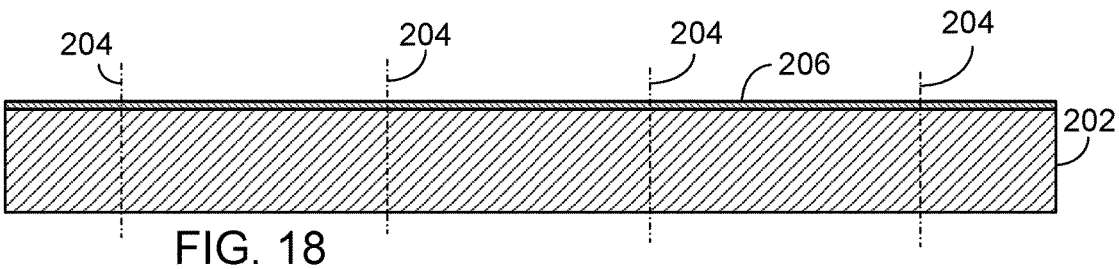
FIGS. 18-24, 24A-24B, 25, 25A and 26-29 illustrate examples fabrication processes for making a sensor module that includes an array of lens stacks mounted on a FFL correction structure.
Figure 19:
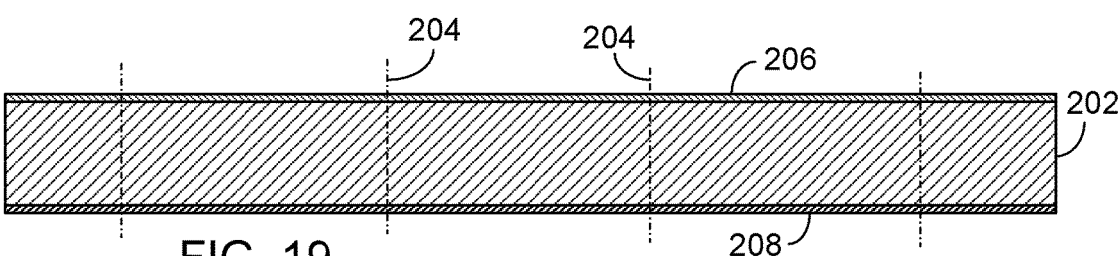
Figure 20:
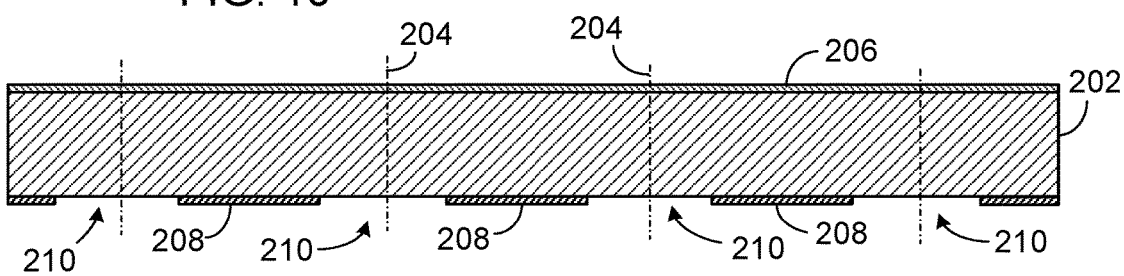

FIGS. 18 through 29 illustrate an example fabrication process for making a sensor module that includes an array of lens stacks mounted on a FFL correction structure with various features similar to those of FIG. 17. As shown in FIG. 18, a glass or other substrate 202 serves as a first FFL correction substrate. Dashed vertical lines 204 indicate the locations of optical axes for optical channels. An IR filter layer 206 can be coated on the lens stack side of substrate 202 (i.e., the side on which the lens stacks are to be mounted). As shown in FIG. 19, the entire sensor side of FFL substrate 202 (i.e., the side on which the sensor is to be attached) is coated with a black coating 208 (i.e., a material that absorbs all or a substantial amount of light impinging on its surface or that is substantially non-transparent to a particular wavelength or range of wavelengths). Coating 208 can help reduce optical cross-talk or interference caused by stray light. Photolithographic techniques can be used to remove portions of coating 208 to provide openings 210 in the vicinity of the optical channels as shown in FIG. 20.

Figure 21:
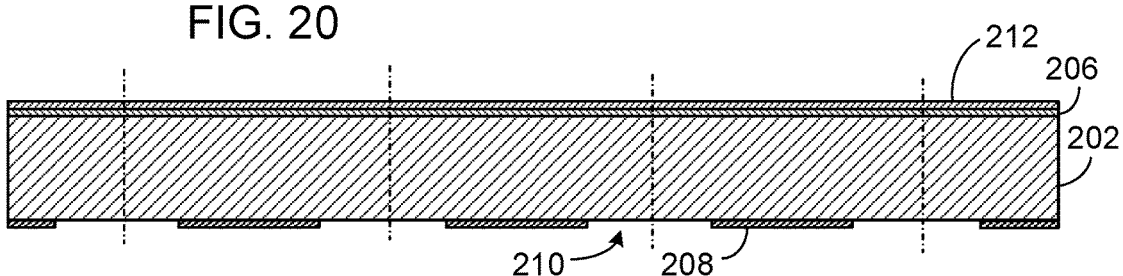
Figure 22:
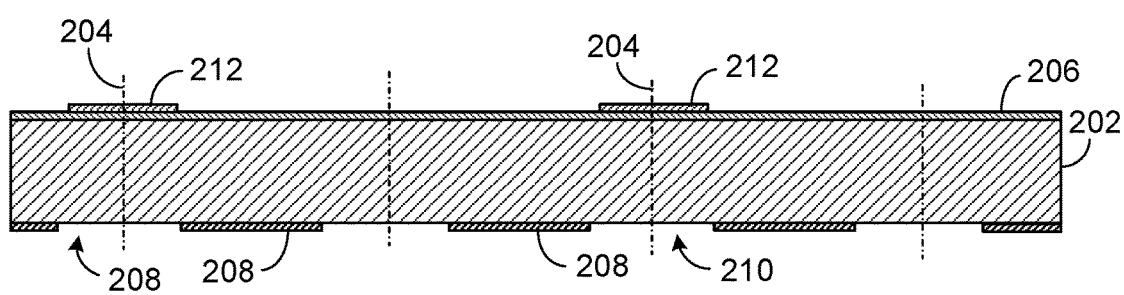
Figure 23:
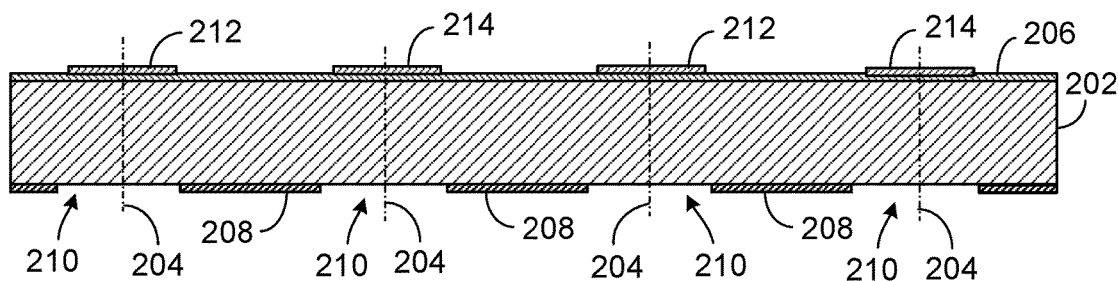

As illustrated in FIG. 21, the lens stack side of FFL substrate 202 is coated with a first color filter layer 212. Next, portions of first color filter layer 212 are removed, for example, by photolithographic techniques, except on areas over selected ones of channel openings 210 (see FIG. 22). The foregoing steps are repeated for a second color filter layer 214, such that, as shown in FIG. 23 each channel opening 210 is covered by one of the first or second color filter layers 212, 214. In the illustrated example, areas above channel openings 210 are covered alternately by either the first color filter layer 212 or the second color filter layer 214. The first and second color filter layers allow selected wavelengths or wavelength ranges (e.g., red, green or blue) to pass through. In some implementations, more than two different color filters are applied. For example, in some cases, three color filters are applied so as to obtain red, green and blue channels.

Figure 24:
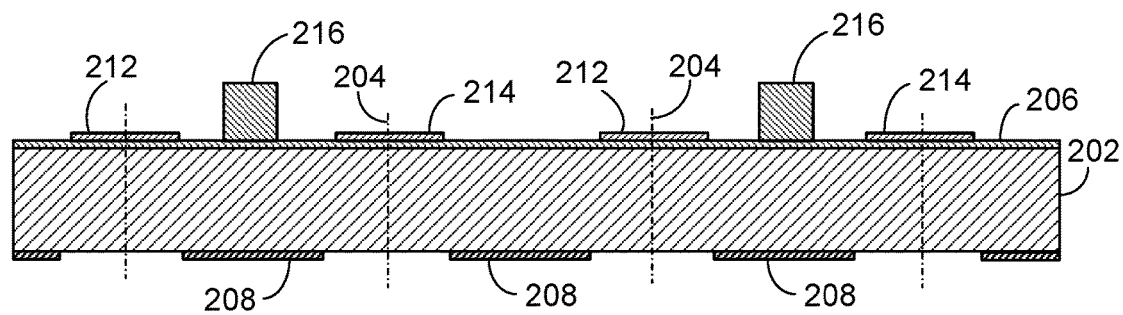
Figure 24A:
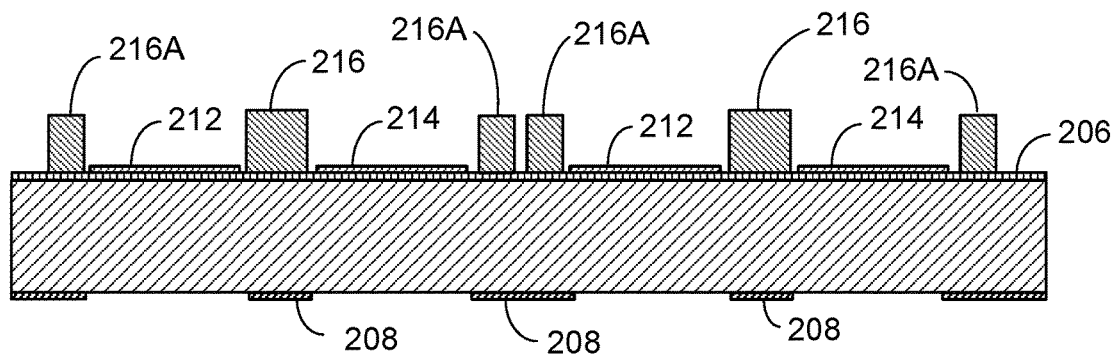
Figure 24B:
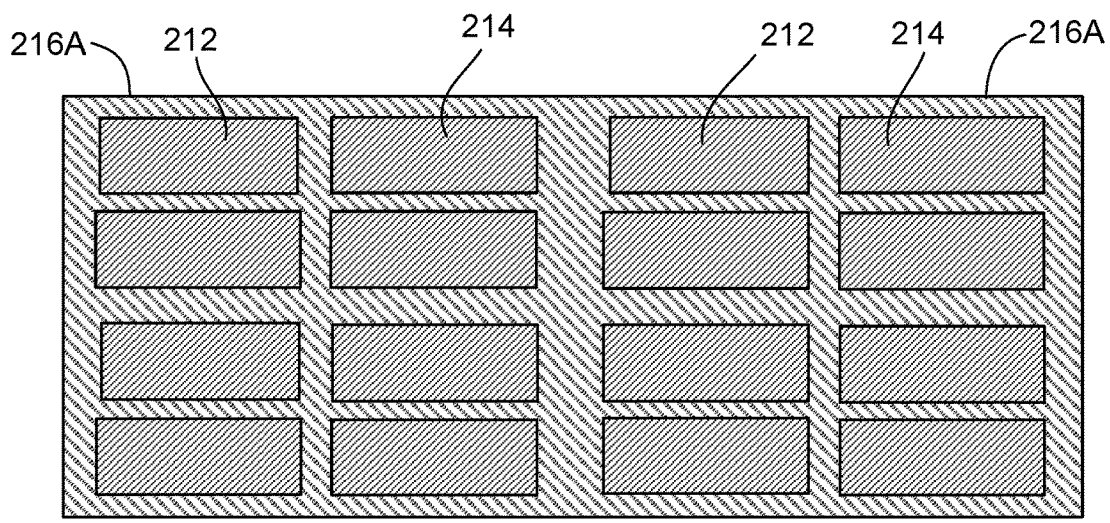

As illustrated by FIG. 24, black spacers 216 (i.e., composed of a material that absorbs all or a substantial amount of light impinging on their surface or that is non-transparent to substantially all the light in a particular wavelength or range of wavelengths) are provided on the lens stack side of FFL substrate 202 between pairs of adjacent color filters 212, 214. Black spacers 216, which can be formed for example by vacuum injection techniques, can help reduce cross channel stray light. In this case, a FFL correction wafer can be placed on a vacuum chuck, and a PDMS tool with spacer sections is brought into contact with the FFL correction wafer. A vacuum is applied, and non-transparent, curable epoxy material is injected into the tool to form the spacers on the FFL correction wafer. The epoxy material can be hardened by applying UV radiation. Alternatively, embossing techniques can be used to form black spacers 216. In some implementations, additional black spacers 216A can be provided on the sides of color filter 212, 214 such that the black spacers 216A surround the color filters in a grid-like manner as shown in FIGS. 24A and 24B. The size and position of black spacers 216 may depend on the dimensions of the overlying lens stacks that are to be placed on FFL substrate 202.

Figure 25:
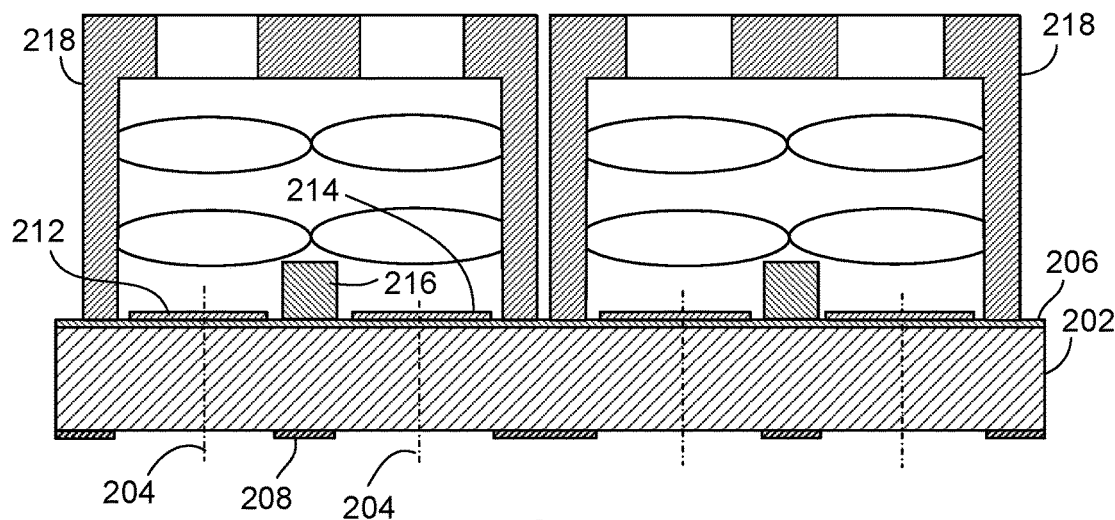
Figure 25A:
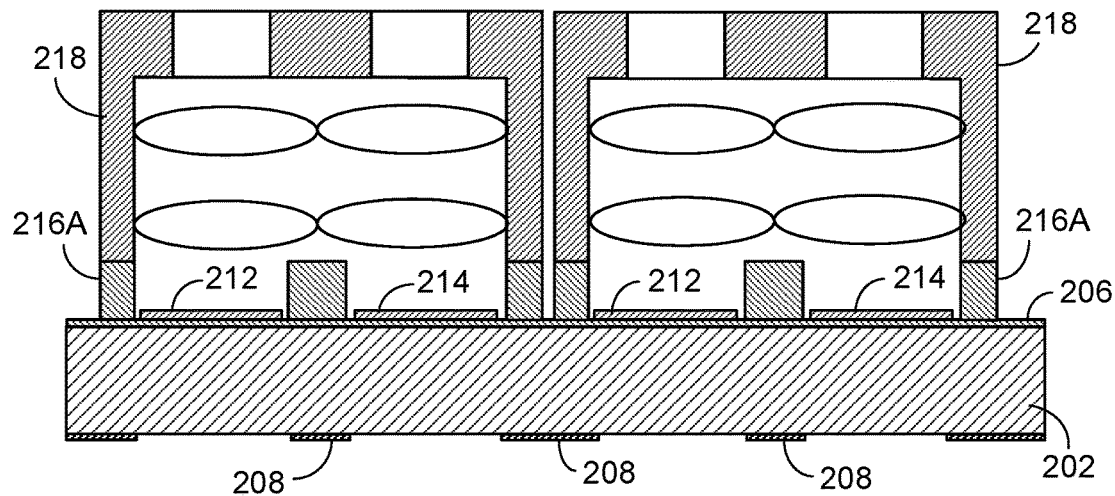

As shown in FIG. 25, individual lens stacks or M×N arrays 218 of lens stacks are attached over the lens stack side of FFL substrate 202. If IR filter layer 206 is not present, then M×N arrays 218 can be attached directly to the lens stack side of FFL substrate 202. Otherwise, M×N arrays 218 can be attached to the upper surface of IR filter layer 206. If black spacers 216 surround the color filters as in FIG. 24A, then the lens stack can be mounted directly on the black spacers 216 as shown in FIG. 25A.

Figure 26:
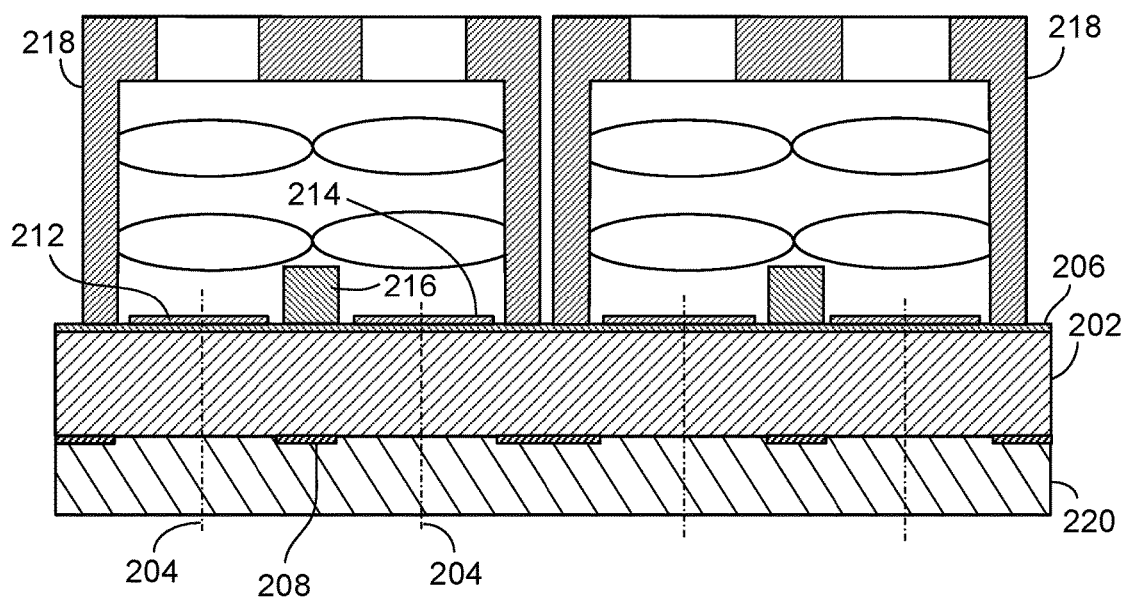
Figure 27:
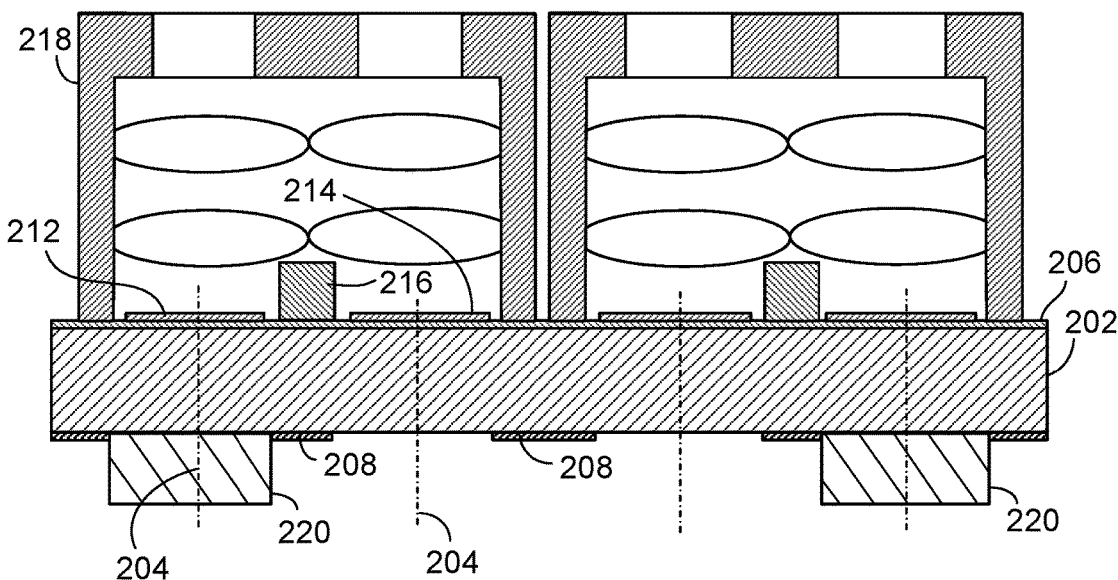

Next, the FFL is measured for each lens stack in M×N arrays 218. A channel FFL correction layer 220 then is attached or applied (e.g., by coating techniques such as spin coating, spraying or sputtering) to the sensor side of FFL substrate 202, as illustrated in FIG. 26. Channel FFL layer 220 can be composed, for example, of a glass material and/or polymer material. Based on the FFL measurement for each lens stack, photolithographic techniques are used to remove portions of channel FFL correction layer 220 below the various lens stacks so as to achieve desired FFL values for the lens stacks. Since the lens stacks may have different FFL values, different amounts of channel FFL correction layer 220 may be needed to achieve corrected FFL values for the various lens stacks (see FIG. 27). For some lens stacks, no FFL correction may be needed, in which case channel FFL correction layer 220 can be removed in its entirety in the areas below those particular lens stacks. In other cases, a portion of channel FFL correction layer 220 may be removed in the area below a particular lens stack. In yet other cases, no portion of channel FFL correction layer 220 may be removed below a particular lens stack. Thus, depending on the implementation, channel FFL correction layer 220 may be present for all of the lens system or only some of the lens systems. Furthermore, the thickness of the final channel FFL correction layer 220 may vary from one lens system to the next, depending on the amount of FFL correction needed for each lens system.

Figure 28:
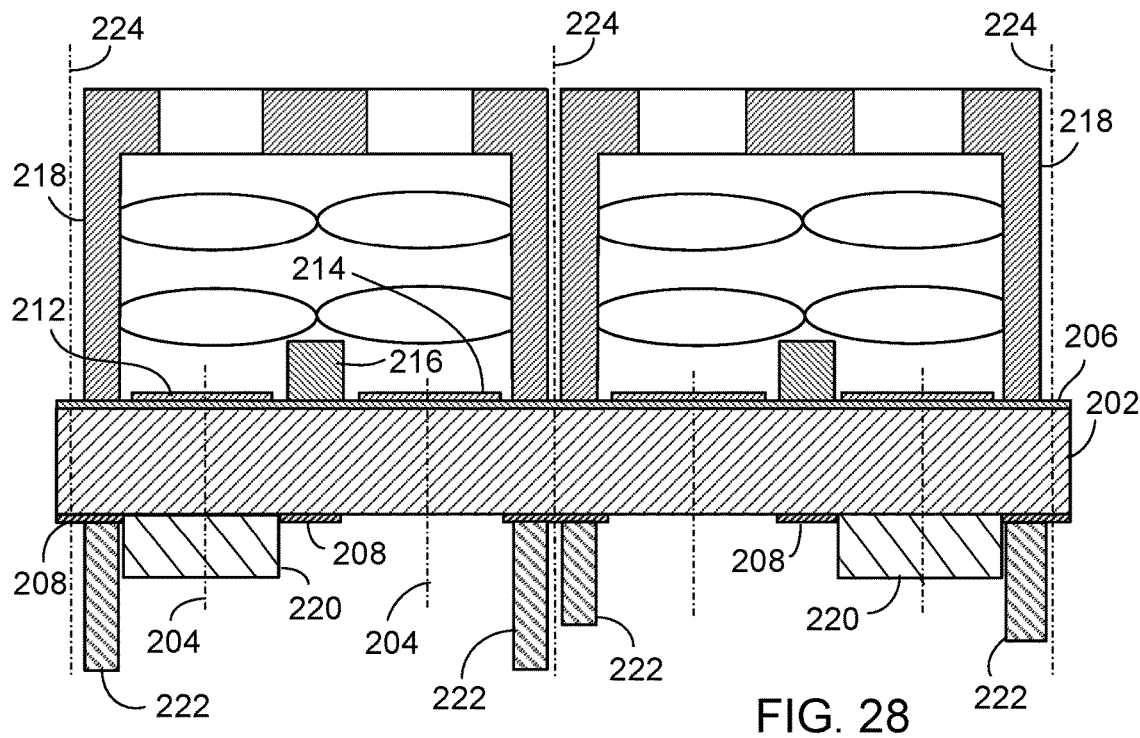

Next, as shown in FIG. 28, spacers 222 can be attached, for example, at the sensor side of FFL substrate 202 (e.g., to the lower surface of black coating 208), which can increase the stability of the module. In some implementations, spacers 222 are provided by a vacuum injection technique. Spacers 222 can serve as a module FFL correction layer. The height of the spacers 222 can be adjusted separately for each module (e.g., each 2×2 array of lens stacks) to compensate for the FFL variation. Such adjustments can be performed, for example, using micromachining techniques. The individual modules can be separated, for example, by dicing along dicing lines 224.

Figure 29:
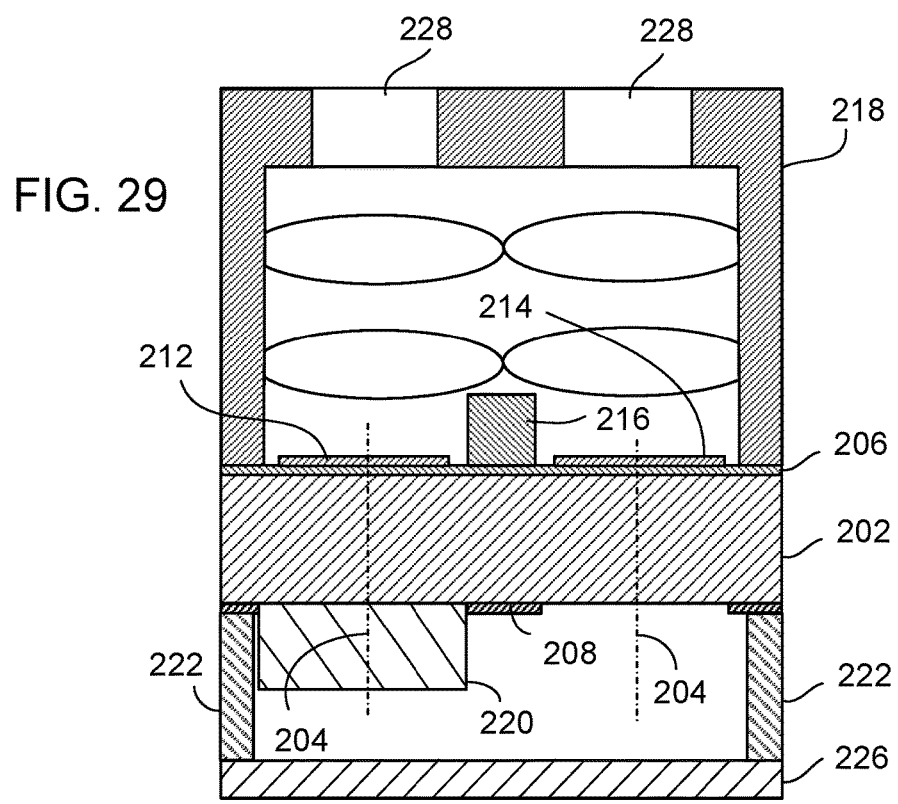

An image sensor 226 then can be attached to the lower side of spacers 222, as shown in FIG. 29. Image sensor 226 can include, for example, multiple light emitting and/or light sensing elements aligned, respectively, with different optical channels 204 in the module. Above each lens system is a respective opening 228 that is substantially aligned with the optical axis 204 of a particular one of the lens systems and that allows light to enter or exit the module. The foregoing techniques can provide a module with one or more lens stacks having FFL values that are adjusted to achieve effective desired values using a FFL correction structure.

In some implementations, the various steps of FIGS. 18-29 may be performed in a different order. For example, it is possible to process color filters 212, 214 and black spacers 216 before applying black coating 208. It is also possible to measure the FFL of the lens stacks separately before they are attached to the FFL correction structure, and to proceed with subsequent processing steps (e.g., as in FIG. 26, 27, 28, 30 or 31) without the lens stack attached. In some cases, some of the steps may be omitted or additional steps may be added. Depending on the implementation, coatings 206, 208, 212, 214 can be applied to the lens side or the sensor side of FFL correction substrate 202 or channel FFL correction layer 220.

Figure 30:
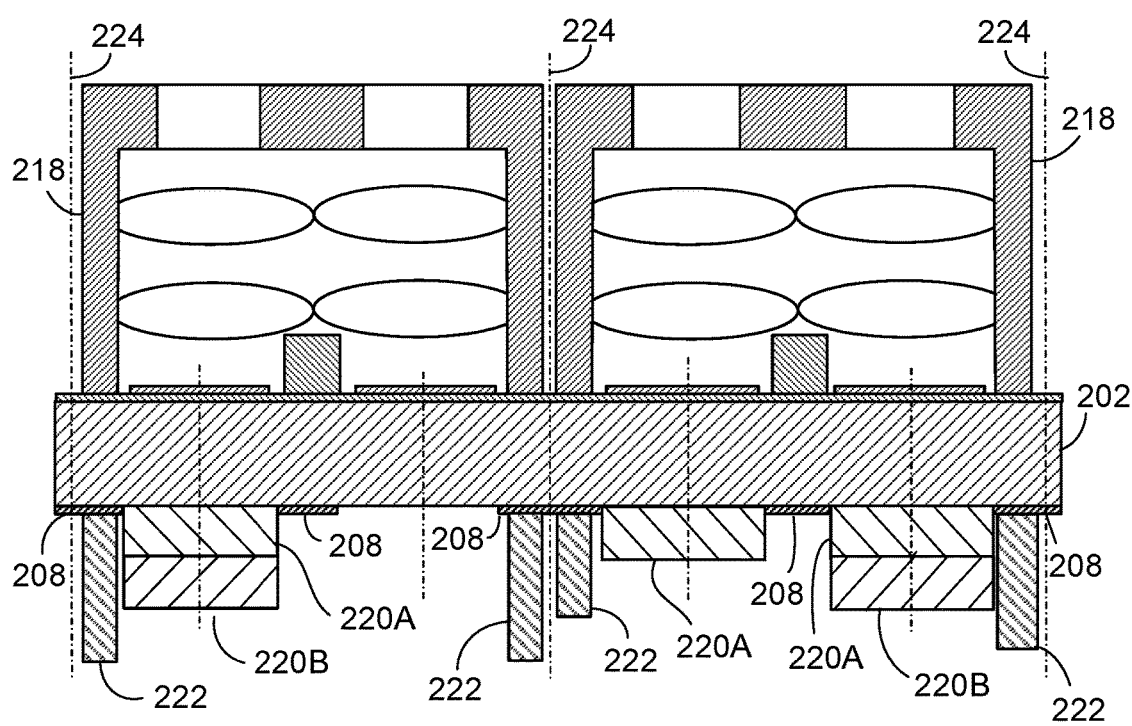
FIGS. 30 through 32 illustrate other examples of modules that include an array of lens stacks with a FFL correction structure.

Depending on the amount of FFL compensation required for a particular lens stack, multiple channel FFL correction layers 220A, 220B can be provided. An example is illustrated in FIG. 30, which shows the use of a first channel FFL correction layer for some of the lens stacks, and the use of first and second channel FFL correction layers 220A, 220B for other of the lens stacks.

Figure 31:
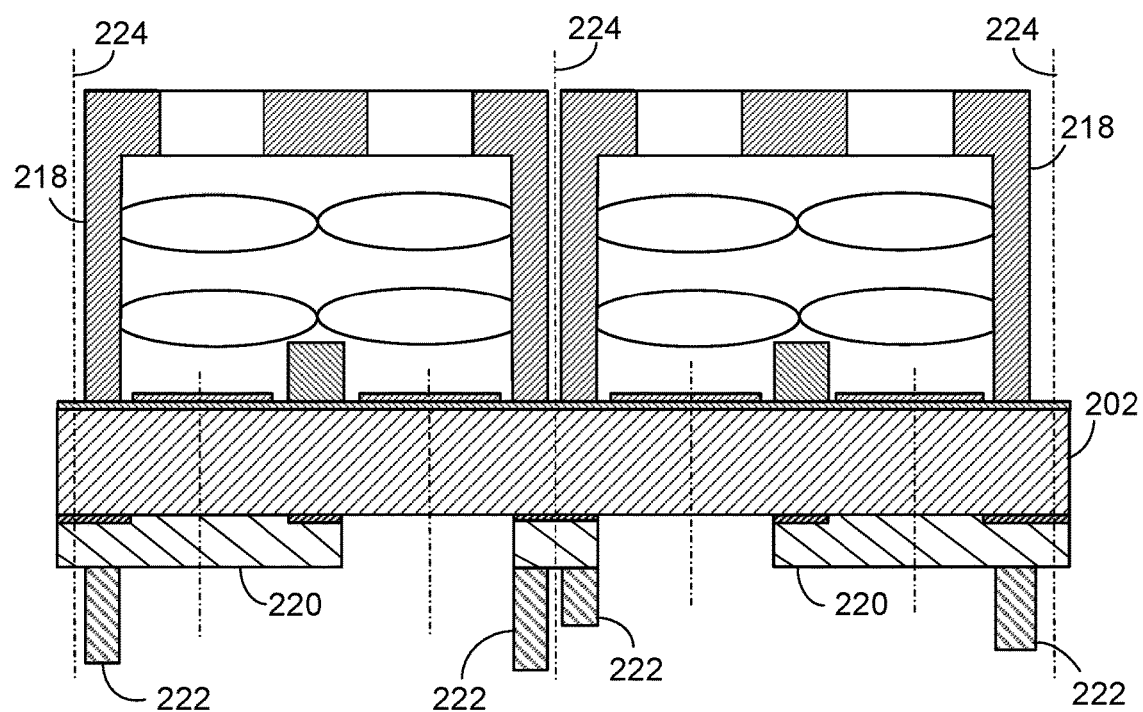

Instead of using photolithographic techniques to remove portions of channel FFL correction layer 220 (see the description above in connection with FIGS. 26 and 27), micromachining techniques can be used to remove portions of channel FFL correction layer 220 (see FIG. 31). In that case, FFL correction spacers 222 for the modules can be attached to channel FFL correction layer 220 (see FIG. 31), instead of being attached to black coating 208.

Figure 32:
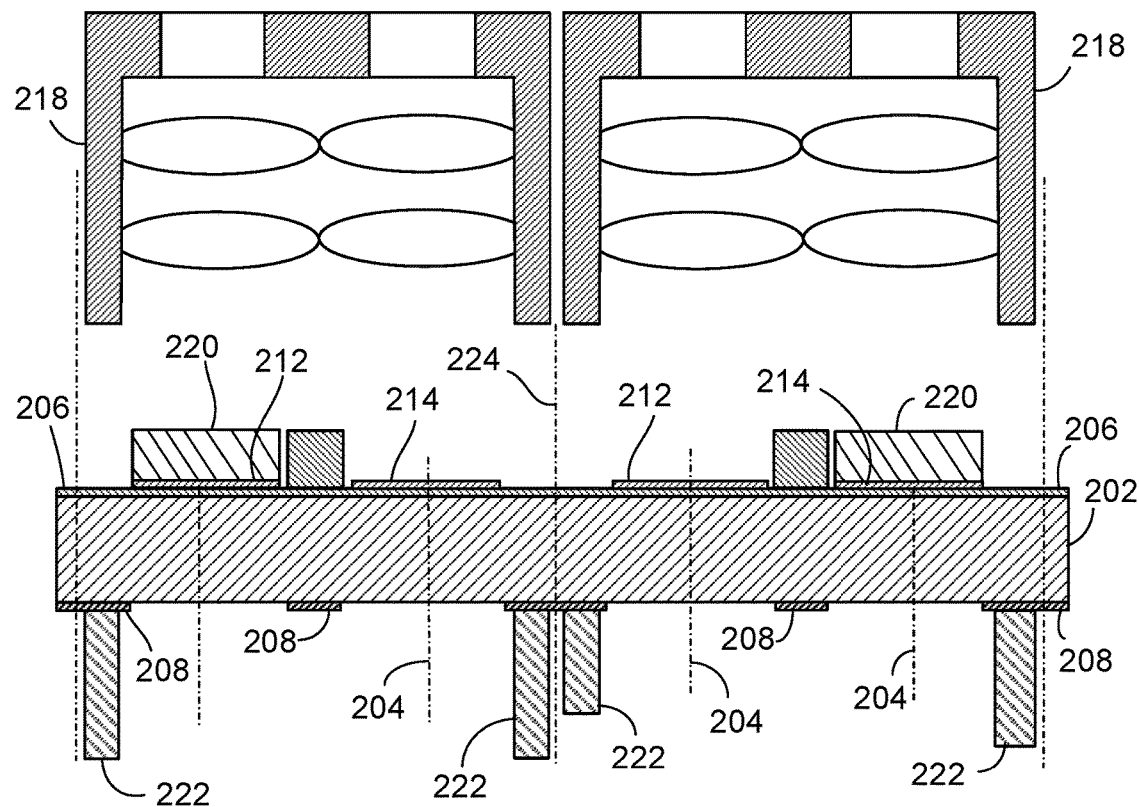

In the foregoing examples, channel FFL correction layer 220 is attached at the sensor side of FFL correction substrate 202 (i.e., on the image sensor side). In some implementations, a channel FFL correction layer 220 can be attached to the lens stack side of FFL correction substrate 202. For example, as illustrated in FIG. 32, channel FFL correction layer 220 can be provided over color filter layers 212, 214 in the particular optical channels for those lens stacks requiring FFL correction. Channel FFL correction layer 220 can be added, for example, prior to mounting the lens stacks. Photolithographic techniques can be used to form channel FFL correction layer 220. Such techniques can be particularly useful, for example, if the lens stacks display a relatively uniform and reproducible FFL variation.

Figure 33:
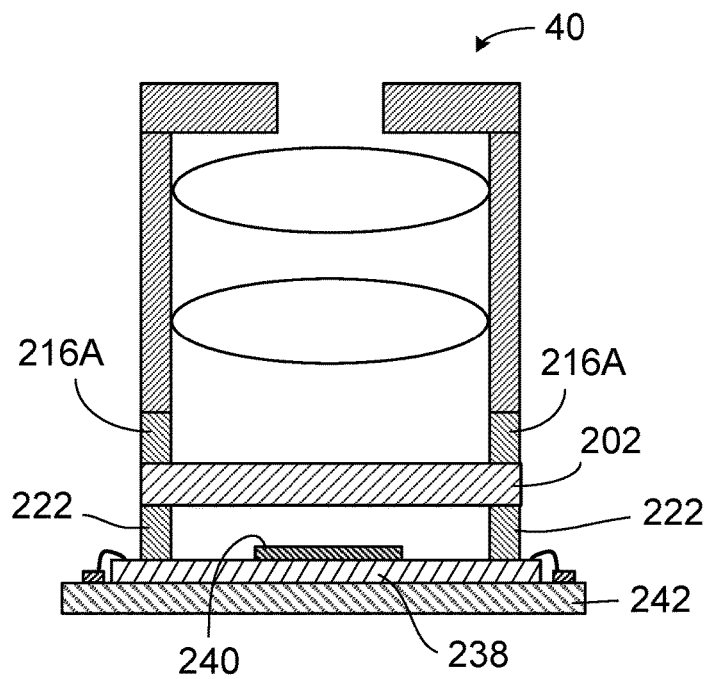
FIG. 33 illustrates an example of a single channel module according to the present invention.

As described above in connection with FIG. 28 for modules that include multiple optical channels, FFL correction layers 202 can be added, as needed, to provide FFL correction for individual channels, and spacers 222 can be added to provide FFL correction for the module as a whole. In situations where the module includes only a single optical channel (rather than multiple channels), spacers can be attached to the transparent substrate 202, and their height adjusted to provide a desired FFL correction for the optical channel. As the module includes only a single optical channel, there is no need to include separate FFL correction layers 220. An example of such a module is illustrated in FIG. 33, which shows lens stack 40 attached to a transparent cover 202 by way of a first spacer 216A. The sensor side of the transparent cover 202 is attached, by way of a second spacer 222, to an image sensor 238 that includes a light detecting element (e.g., a photodiode) 240. In this and the other implementations described above, the spacers 216A, 222 can be, for example, ring shaped and can be formed, for example, by vacuum injection. The image sensor 238 is mounted on a substrate 242.

Figure 34:
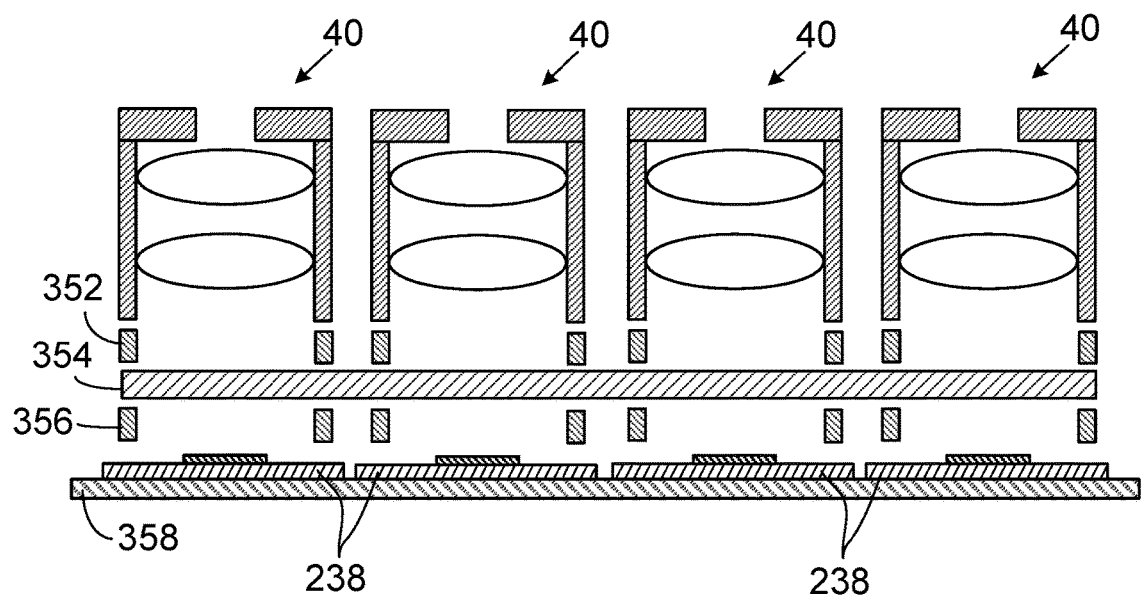
FIG. 34 illustrates a wafer-level technique for fabricating single channel modules.

The single channel module of FIG. 33 can be fabricated, for example, using a wafer-level technique. As shown in FIG. 34, first spacers 352 are attached to one side of a transparent wafer 354, and second spacers 356 are attached to the second side of the transparent wafer 404. Spacers wafers can be used to provide the first and second spacers 352, 356. In some implementations, the spacers 352, 356 are formed on the transparent wafer 354 by a vacuum injection technique. The transparent wafer 354 can be composed, for example, of glass or polymer material, whereas the spacers 352, 356 can be composed, for example, of a non-transparent material. Singulated injection molded lens stacks 40 are attached to the first spacers 352. The FFL of each lens stack 40 then is measured and, if needed, the height of the spacers 356 where the lens stack 40 is attached can be adjusted to provide FFL correction for the optical channel. The height of the spacers 356 can be adjusted, for example, by micromachining or other techniques. The sensor side spacer wafer 356 then is attached to respective image sensors 238 mounted on a substrate wafer (e.g., a printed circuit board wafer) 358. The resulting stack can be separated (e.g., by dicing) to obtain single channel modules.

Figure 35:
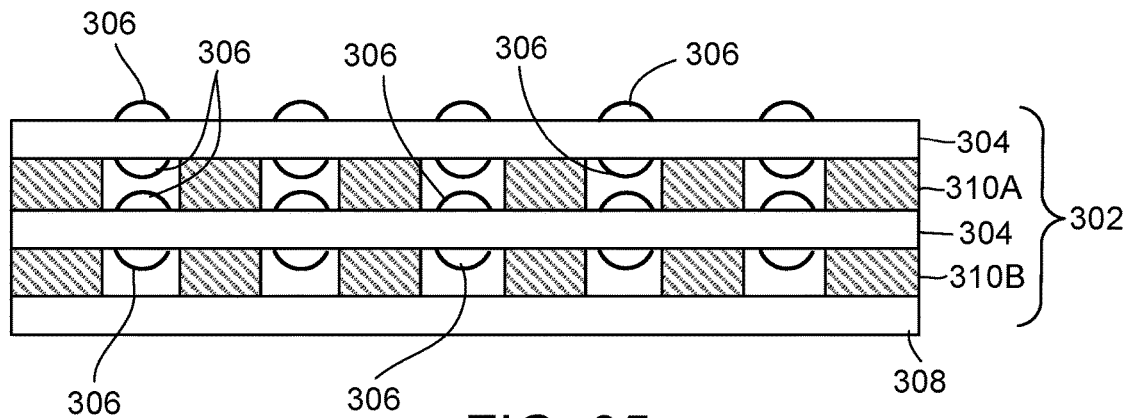
FIGS. 35 through 38 illustrate a wafer-level technique for forming an optics/spacer stack that includes multiple lens stacks.

In the foregoing examples, mounting the lens stacks on the FFL correction substrate preferably is performed by placing individual (i.e., singulated) lens stacks onto the FFL correction substrate. However, in some implementations, instead of placing singulated lens stacks on the FFL correction substrate, a stack 302 of transparent optics wafers 304, each of which has multiple lenses 306, can be placed on a FFL correction substrate 308 (see FIG. 35). The stack 302 of optics wafers 304 can include non-transparent spacers 310A, 310B that separate the optics wafers 304 from one another and from the FFL correction substrate 308.

Figure 36:
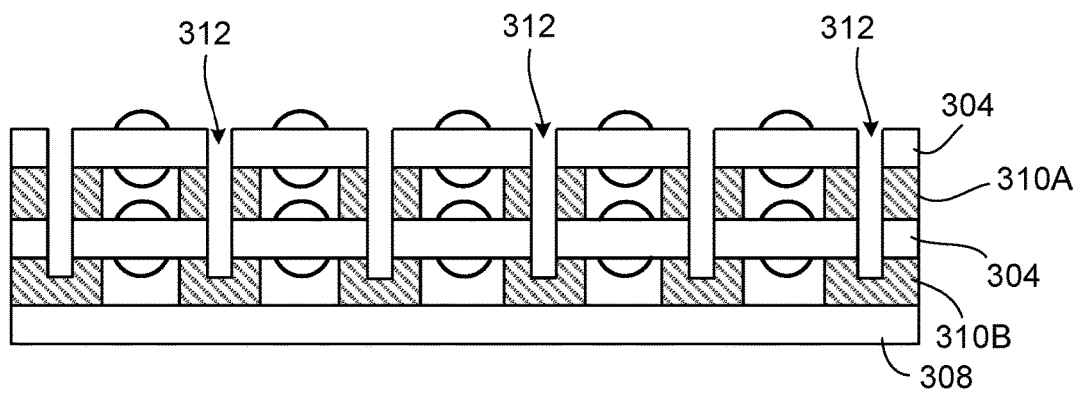

The spacer/optics stack 302 can be attached to the FFL correction substrate 308 using, for example, a thermally stable adhesive. In order to prevent stray light, openings such as trenches 312 are formed between the lens stacks and subsequently are filled with non-transparent material (see FIG. 36). Trenches 312 should extend entirely through the thickness of both wafers 304 and, preferably, should extend at least partially into lower spacers 310B. In some cases, the trenches 312 can extend to the upper surface of the FFL correction substrate 308. Trenches 312 can be formed, for example, by dicing, micromachining or laser cutting techniques. As explained below, trenches 312 subsequently can be filled with a non-transparent material so as to provide a non-transparent layer on the sidewalls of the various portions of the transparent wafers 304.

Figure 37:
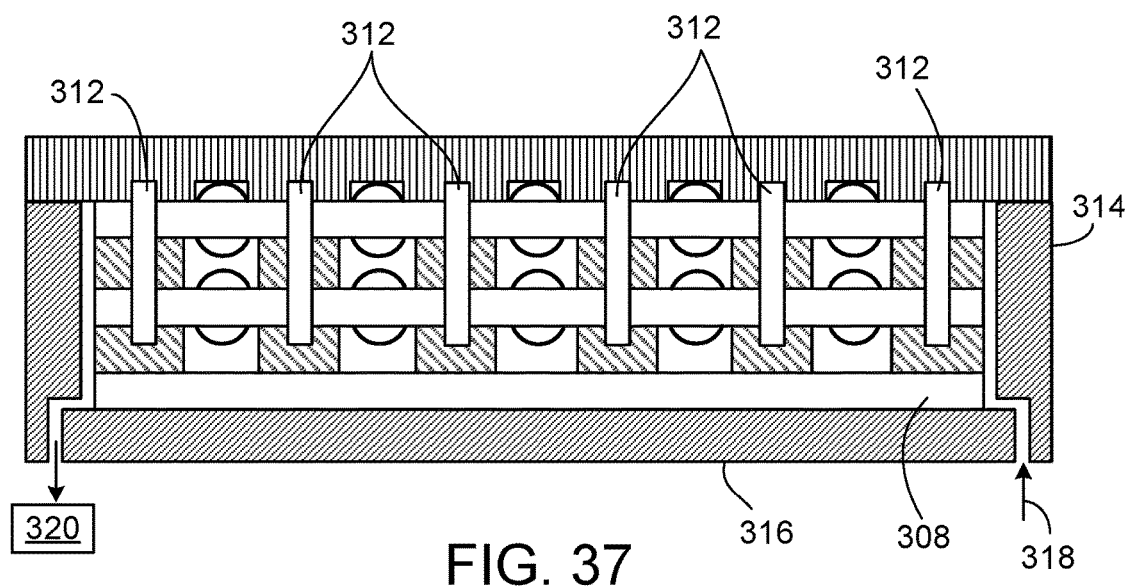

As shown in FIG. 37, a vacuum injection PDMS tool 314 is placed over the spacer/optics stack 302 to facilitate filling trenches 312 with a non-transparent material (e.g., epoxy with carbon black). A vacuum chuck 316 is provided below and around the spacer/optics stack 302 so as to apply a vacuum between the vacuum injection tool 314 and the FFL correction substrate 308. The non-transparent material can be injected into an inlet 318 in the vacuum chuck 316. A vacuum pump 320 near an outlet of the vacuum chuck 316 facilitates flow of the injected non-transparent material. Examples of the non-transparent material include UV- or thermally-curing epoxies (or other polymers) containing carbon black (or another dark pigment) or an inorganic filler or a dye. In some implementations, the additive is embedded in the epoxy (or other polymer).

Figure 38:
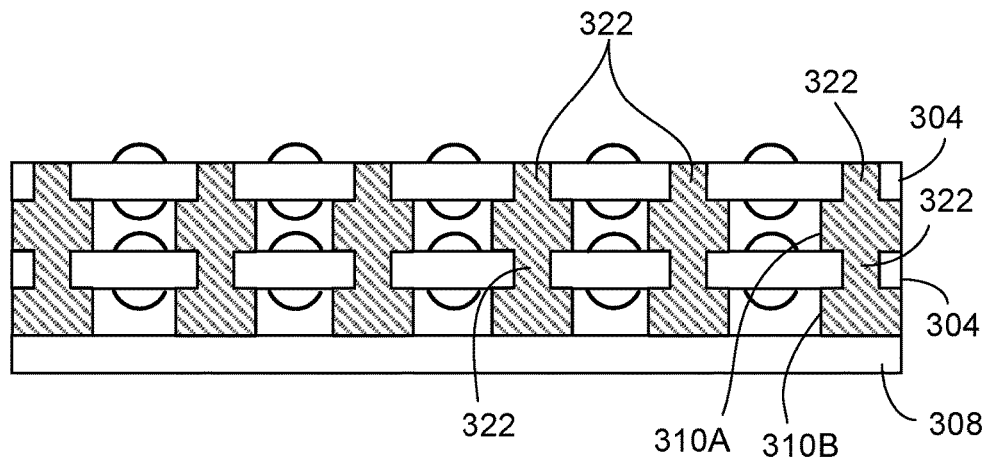

After filling trenches 312 with the non-transparent material under vacuum, the material is hardened (e.g., by UV or thermal curing), and the tool 314 is removed from the spacer/optics stack 302. The result, as shown in FIG. 38, is that non-transparent regions 322 (e.g., epoxy with carbon black) are formed between adjacent portions of the transparent optics wafers 304. The top portion of the non-transparent regions 322 can be substantially flush with the exterior surface of the various portions of the transparent optics wafers 304 and can be composed of the same non-transparent material or a different non-transparent material as spacers 310A, 310B. In some implementations, a baffle wafer composed of a non-transparent material is attached over the optics/spacer stack 302. In other implementations, the baffle wafer can be omitted.

After forming the non-transparent regions 322 and removing the vacuum injection tool 314, the FFL correction substrate 308 can be processed as described above. Thus, for example, a method of fabricating optical devices can include attaching, over a transparent FFL correction substrate, an optics/spacer stack that includes a plurality of lens systems. In some cases, openings such as trenches are formed through portions of the optics/spacer stack that separate the lens systems from one another, and the openings then are filled with a non-transparent material. The thickness of the substrate can be adjusted below at least some of the lens systems to provide respective focal length corrections for the lens systems. Adjusting the thickness of the substrate may include removing selected portions of the FFL correction substrate or adding one or more layers below at least some of the lens systems so as to correct for variations in the focal lengths of the lens systems. Subsequently, the FFL correction substrate can be separated into a plurality of optical modules, each of which includes one or more of the lens systems mounted over a portion of the FFL correction substrate. The sides of the resulting modules, including the sides of the transparent substrates on which the lenses are formed, are covered by non-transparent material, which can help reduce stray light from entering the modules.

Other implementations are within the scope of the claims.

What is claimed is:

1. A method of fabricating optical devices, the method comprising:

attaching, over a substrate that is transparent to light of a particular wavelength or range of wavelengths, a wafer stack that includes a plurality of lens systems adjacent one another, the wafer stack including a plurality of wafers separated from one another by a first spacer, the wafer stack including a surface of one of the plurality of wafers farthest from the substrate;

forming openings in portions of the wafer stack that separate the lens systems from one another, the openings being formed in a direction perpendicular to a plane of the substrate, each particular one of the openings extending from a plane that is flush with the surface of the wafer farthest from the substrate, the openings extending at least partially into a second spacer that separates the substrate from the plurality of wafers;

injecting a material into the openings, wherein the material is non-transparent to light of the particular wavelength or range of wavelengths, wherein the non-transparent material injected into the openings substantially fills the openings at least up to the surface of the wafer farthest from the substrate;

adjusting a thickness of one or more regions of the substrate to provide focal length correction for a respective one or more of the lens systems; and separating the substrate into a plurality of optical modules, each of which includes one or more of the lens systems mounted over a respective portion of the substrate.

2. The method of claim 1 wherein at least one of the first spacer or the second spacer is non-transparent to light of the particular wavelength or range of wavelengths, optical elements being disposed on the plurality of wafers to form the lens systems, wherein each optical module of the plurality of optical modules includes lateral sides of sections of wafers, on which the lenses are disposed, covered by the material that is non-transparent to light of the particular wavelength or range of wavelengths.

3. The method of claim 1 wherein the openings are trenches.

4. The method of claim 3 including forming the trenches so as to extend through an entire thickness of the plurality of wafers.

5. The method of claim 3 including forming the trenches so as to extend to an upper surface of the substrate.

6. The method of claim 1 wherein the non-transparent material is injected into the openings in the wafer stack by vacuum injection.

7. The method of claim 1 wherein the non-transparent material is injected into the openings in the wafer stack using a vacuum injection PDMS tool.

8. The method of claim 1 wherein the non-transparent material injected into the openings comprises a UV-curing polymer.

9. The method of claim 1 wherein the non-transparent material injected into the openings comprises a thermally-curing polymer.

10. The method of claim 1 wherein the non-transparent material injected into the openings comprises a polymer containing a dark pigment, an inorganic filler or a dye.

11. The method of claim 1 wherein the non-transparent material injected into the openings provides a surface that is substantially flush with the surface of the wafer farthest from the substrate.

12. The method of claim 1 wherein the non-transparent material injected into the openings is composed of a same material as at least one of the first spacer or the second spacer.

13. The method of claim 1 wherein adjusting a thickness of one or more regions of the substrate to provide focal length correction includes removing selected portions of the substrate.

14. The method of claim 1 wherein adjusting a thickness of one or more regions of the substrate to provide focal length correction includes adding one or more layers on the substrate.

15. A method of fabricating optical modules, the method comprising:

providing a wafer/spacer stack attached to a flange focal length correction substrate, wherein the wafer/spacer stack includes a plurality of wafers separated from one another by a first spacer, the wafer/spacer stack being separated from the flange focal length correction substrate by a second spacer, the first and second spacers being composed of a material that is non-transparent to light of a particular wavelength or range of wavelengths, optical elements being disposed on the plurality of wafers to form lens systems, and the wafer/spacer stack including a surface of one of the plurality of wafers farthest from the flange focal length correction substrate;

forming trenches in respective portions of the wafer/spacer stack, the trenches separating the lens systems from one another, each particular one of the trenches extending from a plane that is flush with the surface of the wafer farthest from the substrate, the trenches extending at least partially into the second spacer that separates the substrate from the wafer/spacer stack;

injecting a material into the trenches, wherein the injected material is non-transparent to light of the particular wavelength or range of wavelengths, wherein the non-transparent material injected into the trenches substantially fills the trenches at least up to the surface of the wafer farthest from the flange focal length correction substrate; and adjusting a thickness of one or more regions of the flange focal length correction substrate to provide focal length correction for a respective one or more of the lens systems.

16. The method of claim 15 including forming the trenches so as to extend through an entire thickness of the plurality of wafers.

17. The method of claim 15 wherein the non-transparent material injected into the trenches is injected by a vacuum injection technique.

18. The method of claim 15 wherein the non-transparent material injected into the trenches comprises at least one of a UV-curing polymer or a thermally-curing polymer.

* * * * *